United States Patent
Guidarelli et al.

(10) Patent No.: US 12,261,762 B2
(45) Date of Patent: *Mar. 25, 2025

(54) DETECTING AND LOCALIZING CABLE PLANT IMPAIRMENTS USING FULL BAND CAPTURE SPECTRUM ANALYSIS

(71) Applicant: Charter Communications Operating, LLC, St. Louis, MO (US)

(72) Inventors: Ben J. Guidarelli, Cazenovia, NY (US); William Berger, Charlotte, NC (US)

(73) Assignee: CHARTER COMMUNICATIONS OPERATING, LLC, St. Louis, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/217,816

(22) Filed: Jul. 3, 2023

(65) Prior Publication Data
US 2023/0358797 A1    Nov. 9, 2023

Related U.S. Application Data

(63) Continuation of application No. 17/308,394, filed on May 5, 2021, now Pat. No. 11,726,128.

(51) Int. Cl.
*H04L 43/50* (2022.01)
*G01R 23/16* (2006.01)

(52) U.S. Cl.
CPC ............ *H04L 43/50* (2013.01); *G01R 23/16* (2013.01)

(58) Field of Classification Search
CPC ......... G01R 23/16; H04L 43/50; H04L 43/10; H04L 41/16
See application file for complete search history.

(56) References Cited

U.S. PATENT DOCUMENTS 7,792,963 B2    9/2010   Gould
9,497,451 B2 *  11/2016  Hurst ................. H04N 17/00
(Continued)

FOREIGN PATENT DOCUMENTS

CN    106469098 A  *  3/2017

OTHER PUBLICATIONS

Full Band Capture Revisited, A Technical Paper prepared for SCTE•ISBE by Ron Hranac, Technical Marketing Engineer, Cisco Systems, 2020 SCTE•ISBE and NCTA, pp. 1-46.
(Continued)

*Primary Examiner* — Lee E Rodak
*Assistant Examiner* — Demetrius R Pretlow
(74) *Attorney, Agent, or Firm* — Otterstedt & Kammer PLLC

(57) ABSTRACT

Collect a full band capture spectral reading from a plurality of cable/fiber broadband network customer units (e.g., cable modems or equivalent optical units); for each of the cable/fiber broadband network customer units, construct an ideal spectral reading. For each of the cable/fiber broadband network customer units, subtract the ideal spectral reading from the full band capture spectral reading to obtain a resultant spectrum. For at least one of the cable/fiber broadband network customer units, identify a persistent deviation from zero in the resultant spectrum that does not match a known impairment type. Identify at least one new impairment type corresponding to the persistent deviation from zero. Remediation of the new impairment type can be carried out as appropriate, and/or a detection pattern can be deployed to identify future occurrences of the new impairment type.

29 Claims, 17 Drawing Sheets

(56) References Cited

U.S. PATENT DOCUMENTS

| | | | |
|---|---|---|---|
| 11,316,715 B1* | 4/2022 | Rupe | H04L 25/0212 |
| 2003/0056217 A1 | 3/2003 | Brooks | |
| 2006/0130107 A1 | 6/2006 | Gonder et al. | |
| 2007/0050836 A1* | 3/2007 | Stanek | H04N 21/258 |
| | | | 725/74 |
| 2007/0217436 A1 | 9/2007 | Markley | |
| 2009/0248794 A1 | 10/2009 | Helms | |
| 2010/0313236 A1 | 12/2010 | Straub | |
| 2013/0063608 A1 | 3/2013 | Tierney | |
| 2013/0273956 A1 | 10/2013 | Gallagher | |
| 2014/0010269 A1 | 1/2014 | Ling | |
| 2015/0029869 A1* | 1/2015 | Wolcott | H04B 3/487 |
| | | | 370/242 |
| 2015/0095960 A1 | 4/2015 | Hurst | |
| 2015/0142345 A1 | 5/2015 | Anderson | |
| 2016/0203036 A1* | 7/2016 | Mezic | G06F 11/0751 |
| | | | 714/819 |
| 2017/0230211 A1* | 8/2017 | Teflian | H04B 15/00 |
| 2017/0294960 A1* | 10/2017 | Williams | H04B 10/0775 |
| 2017/0310539 A1* | 10/2017 | Jin | H04L 41/5009 |
| 2017/0310541 A1 | 10/2017 | Jin | |
| 2017/0310562 A1 | 10/2017 | Jin | |
| 2017/0353991 A1* | 12/2017 | Tapia | G06Q 10/20 |
| 2018/0219621 A1* | 8/2018 | Zinevich | H04B 10/07951 |
| 2018/0302120 A1 | 10/2018 | Poletti | |
| 2019/0123818 A1 | 4/2019 | Zhang | |
| 2019/0222310 A1* | 7/2019 | Zinevich | G01R 31/2822 |
| 2020/0097852 A1 | 3/2020 | Zhu | |
| 2020/0186440 A1* | 6/2020 | Towfiq | H04L 41/5032 |
| 2020/0401980 A1* | 12/2020 | Howard | G06Q 10/20 |
| 2022/0109612 A1* | 4/2022 | Bush | H04L 41/0631 |
| 2022/0182254 A1* | 6/2022 | Yates | H04N 21/251 |
| 2022/0357384 A1 | 11/2022 | Guidarelli | |

OTHER PUBLICATIONS

DOCSIS® Best Practices and Guidelines PNM Best Practices: HFC Networks (DOCSIS 3.0) CM-GL-PNMP-V03-160725 Cable Television Laboratories, Inc. 2010-2016 pp. 1-183.

Data-Over-Cable Service Interface Specifications DOCSIS® 3.1 Cable Modem Operations Support System Interface Specification CM-SP-CM-OSSIv3.1-I18-201022 2014-2020 pp. 1-305.

Data-Over-Cable Service Interface Specifications DOCSIS® 4.0 Cable Modem Operations Support System Interface Specification CM-OSSIv4.0-I02-200311 2019-2020 pp. 1-310.

Ron Hranac, Full Band Capture Revisited, downloaded Jan. 25, 2021 from https://broadbandlibrary.com/full-band-capture-revisited/ 8 pages.

Jeff Finkelstein, Full-Band Capture Takes the Stage, downloaded Dec. 15, 2020 from https://broadbandlibrary.com/full-band-capture-takes-the-stage/ 7 pages.

Wiener filter—Wikipedia, downloaded Apr. 15, 2021 from https://en.wikipedia.org/wiki/Wiener_filter, 8 pages.

Design low-pass filters using MATLAB, Low-Pass Filter—MATLAB & Simulink, downloaded Apr. 15, 2021 from https://www.mathworks.com/discovery/low-pass-filter.html, 3 pages.

* cited by examiner

DETECTING AND LOCALIZING CABLE PLANT IMPAIRMENTS USING FULL BAND CAPTURE SPECTRUM ANALYSIS

CROSS-REFERENCE TO RELATED APPLICATION

This application is a continuation of co-assigned U.S. patent application Ser. No. 17/308,394 of inventors Ben J. Guidarelli et al., and claims the benefit thereof, said application Ser. No. 17/308,394 having been filed on May 5, 2021, and entitled "DETECTING AND LOCALIZING CABLE PLANT IMPAIRMENTS USING FULL BAND CAPTURE SPECTRUM ANALYSIS." The complete disclosure of the aforesaid application number Ser. No. 17/308, 394 is expressly incorporated herein by reference in its entirety for all purposes.

FIELD OF THE INVENTION

The present invention relates generally to the electrical, electronic and computer arts, and, more particularly, to the detection and mitigation of issues in communications networks.

BACKGROUND OF THE INVENTION

Network operators, such as cable providers (e.g., cable multi-system operators or MSOs) need to quickly identify network issues and route maintenance efforts. Currently, this is typically based on customer calls or out-of-specification telemetry data.

Cable networks typically include, in the customer's premises, cable modems. Recently, additional functionality has been introduced to these modems, including Proactive Network Maintenance (PNM) and Full Band Capture (FBC). For example, DOCSIS® Best Practices and Guidelines, PNM Best Practices: HFC Networks (DOCSIS 3.0), CM-GL-PNMP-V03-160725, Cable Television Laboratories, Inc. 2010-2016, 07/25/16 notes that FBC is a relatively new concept that takes advantage of low-cost discrete Fourier transform (DFT) and fast Fourier transform (FFT) technology to support spectrum analyzer-like functionality in customer premises equipment such as cable modems.

SUMMARY OF THE INVENTION

Principles of the invention provide techniques for detecting and localizing cable plant impairments using full band capture spectrum analysis. In one aspect, an exemplary method includes collecting a full band capture spectral reading from a plurality of cable/fiber broadband network customer units; for each of the cable/fiber broadband network customer units, constructing an ideal spectral reading; for each of the cable/fiber broadband network customer units, subtracting the ideal spectral reading from the full band capture spectral reading to obtain a resultant spectrum; for at least one of the cable/fiber broadband network customer units, identifying a persistent deviation from zero in the resultant spectrum that does not match a known impairment type; and identifying at least one new impairment type corresponding to the persistent deviation from zero.

In another aspect, an exemplary system includes a poller configured to collect a full band capture spectral reading from a plurality of cable/fiber broadband network customer units; and a correlation engine, coupled to the poller, and configured to: for each of the cable/fiber broadband network customer units, construct an ideal spectral reading; for each of the cable/fiber broadband network customer units, subtract the ideal spectral reading from the full band capture spectral reading to obtain a resultant spectrum; for at least one of the cable/fiber broadband network customer units, identify a persistent deviation from zero in the resultant spectrum that does not match a known impairment type; and facilitate identification of at least one new impairment type corresponding to the persistent deviation from zero.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of an article of manufacture including a machine-readable medium that contains one or more programs which when executed implement one or more method steps set forth herein; that is to say, a computer program product including a tangible computer readable recordable storage medium (or multiple such media) with computer usable program code for performing the method steps indicated. Furthermore, one or more embodiments of the invention or elements thereof can be implemented in the form of an apparatus (e.g., a correlation engine coupled to a poller, and the like) including a memory and at least one processor that is coupled to the memory and operative to perform, or facilitate performance of, exemplary method steps. Yet further, in another aspect, one or more embodiments of the invention or elements thereof can be implemented in the form of means for carrying out one or more of the method steps described herein; the means can include (i) specialized hardware module(s), (ii) software module(s) stored in a tangible computer-readable recordable storage medium (or multiple such media) and implemented on a hardware processor, or (iii) a combination of (i) and (ii); any of (i)-(iii) implement the specific techniques set forth herein.

Aspects of the present invention can provide substantial beneficial technical effects. For example, one or more embodiments of the invention achieve one or more of:
  more efficient diagnosis of impairments in cable plant;
  proactive identification of new types of impairments in cable plant not previously identifiable with prior-art techniques;
  techniques to construct an "ideal" spectrum and subtract same from a returned spectrum to enhance impairment detection;
  improve technological process of operating and maintaining a cable network.

These and other features and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION OF PREFERRED EMBODIMENTS

Figure 1:
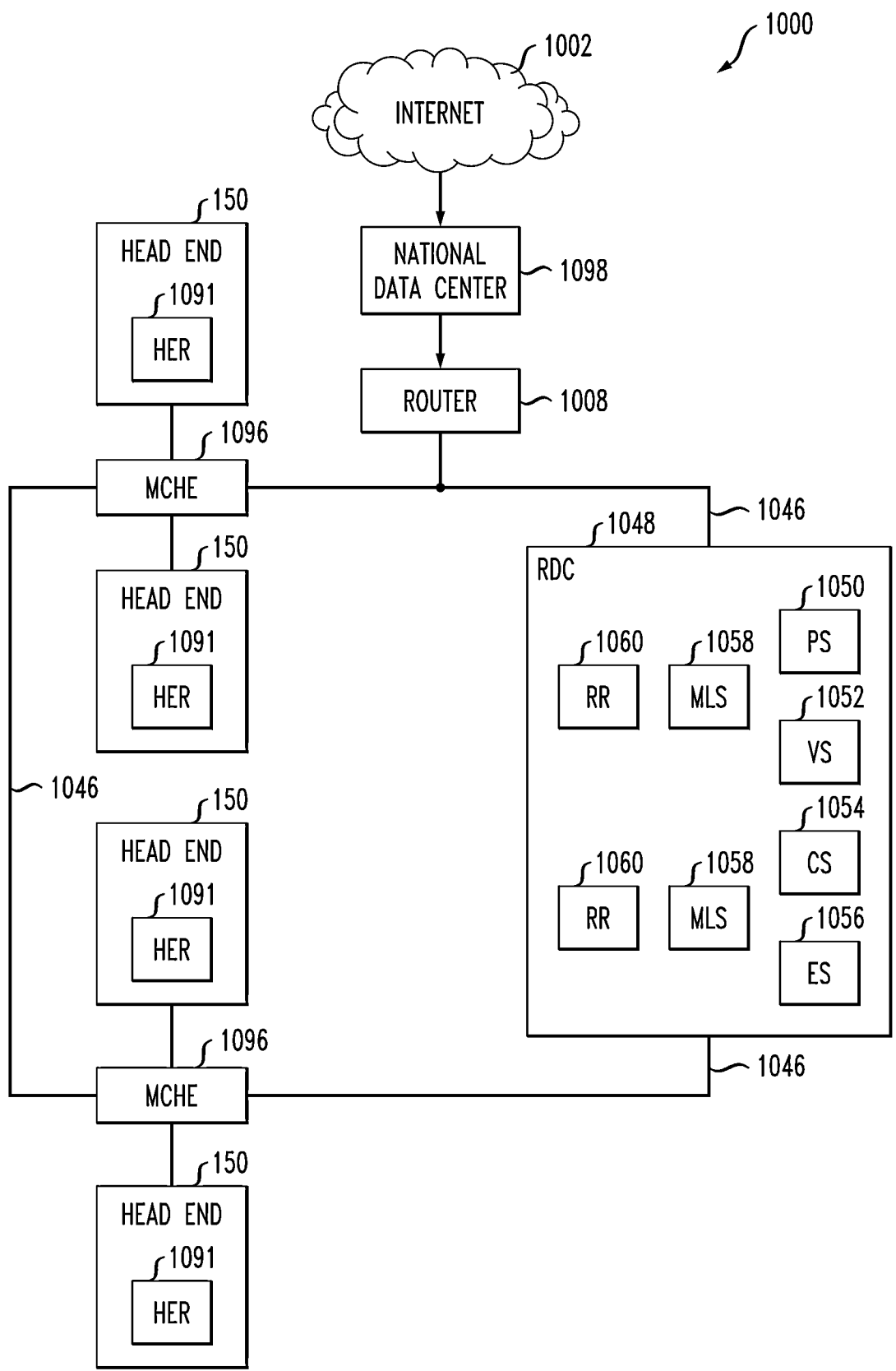
FIG. 1 is a block diagram of an exemplary embodiment of a system, within which one or more aspects of the invention can be implemented.

Purely by way of example and not limitation, some embodiments will be shown in the context of a cable multi-service operator (MSO) providing data services as well as entertainment services. FIG. 1 shows an exemplary system 1000, according to an aspect of the invention. System 1000 includes a regional data center (RDC) 1048 coupled to several Market Center Head Ends (MCHEs) 1096; each MCHE 1096 is in turn coupled to one or more divisions, represented by division head ends 150. In a non-limiting example, the MCHEs are coupled to the RDC 1048 via a network of switches and routers. One suitable example of network 1046 is a dense wavelength division multiplex (DWDM) network. The MCHEs can be employed, for example, for large metropolitan area(s). In addition, the MCHE is connected to localized HEs 150 via high-speed routers 1091 ("HER"=head end router) and a suitable network, which could, for example, also utilize DWDM technology. Elements 1048, 1096 on network 1046 may be operated, for example, by or on behalf of a cable MSO, and may be interconnected with a global system of interconnected computer networks that use the standardized Internet Protocol Suite (TCP/IP) (transfer control protocol/Internet protocol), commonly called the Internet 1002; for example, via router 1008. In one or more non-limiting exemplary embodiments, router 1008 is a point-of-presence ("POP") router; for example, of the kind available from Juniper Networks, Inc., Sunnyvale, California, USA.

Head end routers 1091 are omitted from figures below to avoid clutter, and not all switches, routers, etc. associated with network 1046 are shown, also to avoid clutter.

RDC 1048 may include one or more provisioning servers (PS) 1050, one or more Video Servers (VS) 1052, one or more content servers (CS) 1054, and one or more e-mail servers (ES) 1056. The same may be interconnected to one or more RDC routers (RR) 1060 by one or more multi-layer switches (MLS) 1058. RDC routers 1060 interconnect with network 1046.

A national data center (NDC) 1098 is provided in some instances; for example, between router 1008 and Internet 1002. In one or more embodiments, such an NDC may consolidate at least some functionality from head ends (local and/or market center) and/or regional data centers. For example, such an NDC might include one or more VOD servers; switched digital video (SDV) functionality; gateways to obtain content (e.g., program content) from various sources including cable feeds and/or satellite; and so on.

In some cases, there may be more than one national data center 1098 (e.g., two) to provide redundancy. There can be multiple regional data centers 1048. In some cases, MCHEs could be omitted and the local head ends 150 coupled directly to the RDC 1048.

Figure 2:
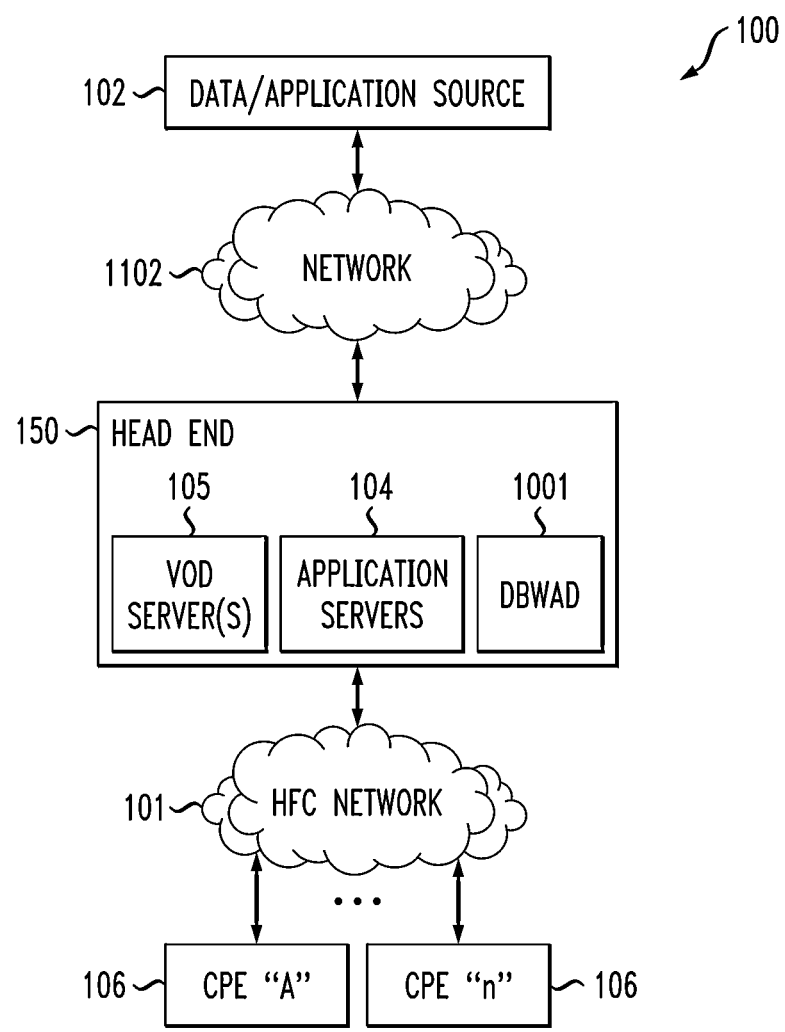
FIG. 2 is a functional block diagram illustrating an exemplary hybrid fiber-coaxial (HFC) divisional network configuration, useful within the system of FIG. 1.

FIG. 2 is a functional block diagram illustrating an exemplary content-based (e.g., hybrid fiber-coaxial (HFC)) divisional network configuration, useful within the system of FIG. 1. See, for example, US Patent Publication 2006/0130107 of Gonder et al., entitled "Method and apparatus for high bandwidth data transmission in content-based networks," the complete disclosure of which is expressly incorporated by reference herein in its entirety for all purposes. The various components of the network 100 include (i) one or more data and application origination points 102; (ii) one or more application distribution servers 104; (iii) one or more video-on-demand (VOD) servers 105, and (v) consumer premises equipment or customer premises equipment (CPE). The distribution server(s) 104, VOD servers 105 and CPE(s) 106 are connected via a bearer (e.g., HFC) network 101. Servers 104, 105 can be located in head end 150. A simple architecture is shown in FIG. 2 for illustrative brevity, although it will be recognized that comparable architectures with multiple origination points, distribution servers, VOD servers, and/or CPE devices (as well as different network topologies) may be utilized consistent with embodiments of the invention. For example, the head-end architecture of FIG. 3 (described in greater detail below) may be used.

It should be noted that the exemplary CPE 106 is an integrated solution including a cable modem (e.g., DOCSIS) and one or more wireless routers. Other embodiments could employ a two-box solution; i.e., separate cable modem and routers suitably interconnected, which nevertheless, when interconnected, can provide equivalent functionality. Furthermore, FTTH networks can employ Service ONUs (S-ONUs; ONU=optical network unit) as CPE, as discussed elsewhere herein.

The data/application origination point 102 comprises any medium that allows data and/or applications (such as a VOD-based or "Watch TV" application) to be transferred to a distribution server 104, for example, over network 1102. This can include for example a third-party data source, application vendor website, compact disk read-only memory (CD-ROM), external network interface, mass storage device (e.g., Redundant Arrays of Inexpensive Disks (RAID) system), etc. Such transference may be automatic, initiated upon the occurrence of one or more specified events (such as the receipt of a request packet or acknowledgement (ACK)), performed manually, or accomplished in any number of other modes readily recognized by those of ordinary skill, given the teachings herein. For example, in one or more embodiments, network 1102 may correspond to network 1046 of FIG. 1, and the data and application origination point may be, for example, within NDC 1098, RDC 1048, or on the Internet 1002. Head end 150, HFC network 101, and CPEs 106 thus represent the divisions which were represented by division head ends 150 in FIG. 1.

The application distribution server 104 comprises a computer system where such applications can enter the network system. Distribution servers per se are well known in the networking arts, and accordingly not described further herein.

The VOD server 105 comprises a computer system where on-demand content can be received from one or more of the aforementioned data sources 102 and enter the network system. These servers may generate the content locally, or alternatively act as a gateway or intermediary from a distant source.

The CPE 106 includes any equipment in the "customers' premises" (or other appropriate locations) that can be accessed by the relevant upstream network components. Non-limiting examples of relevant upstream network components, in the context of the HFC network, include a distribution server 104 or a cable modem termination system 156 (discussed below with regard to FIG. 3). The skilled artisan will be familiar with other relevant upstream network components for other kinds of networks (e.g., FTTH) as discussed herein. Non-limiting examples of CPE are set-top boxes, high-speed cable modems, and Advanced Wireless Gateways (AWGs) for providing high bandwidth Internet access in premises such as homes and businesses. Reference is also made to the discussion of an exemplary FTTH network in connection with FIGS. 8 and 9.

Also included (for example, in head end 150) is a dynamic bandwidth allocation device (DBWAD) 1001 such as a global session resource manager, which is itself a non-limiting example of a session resource manager.

Figure 3:
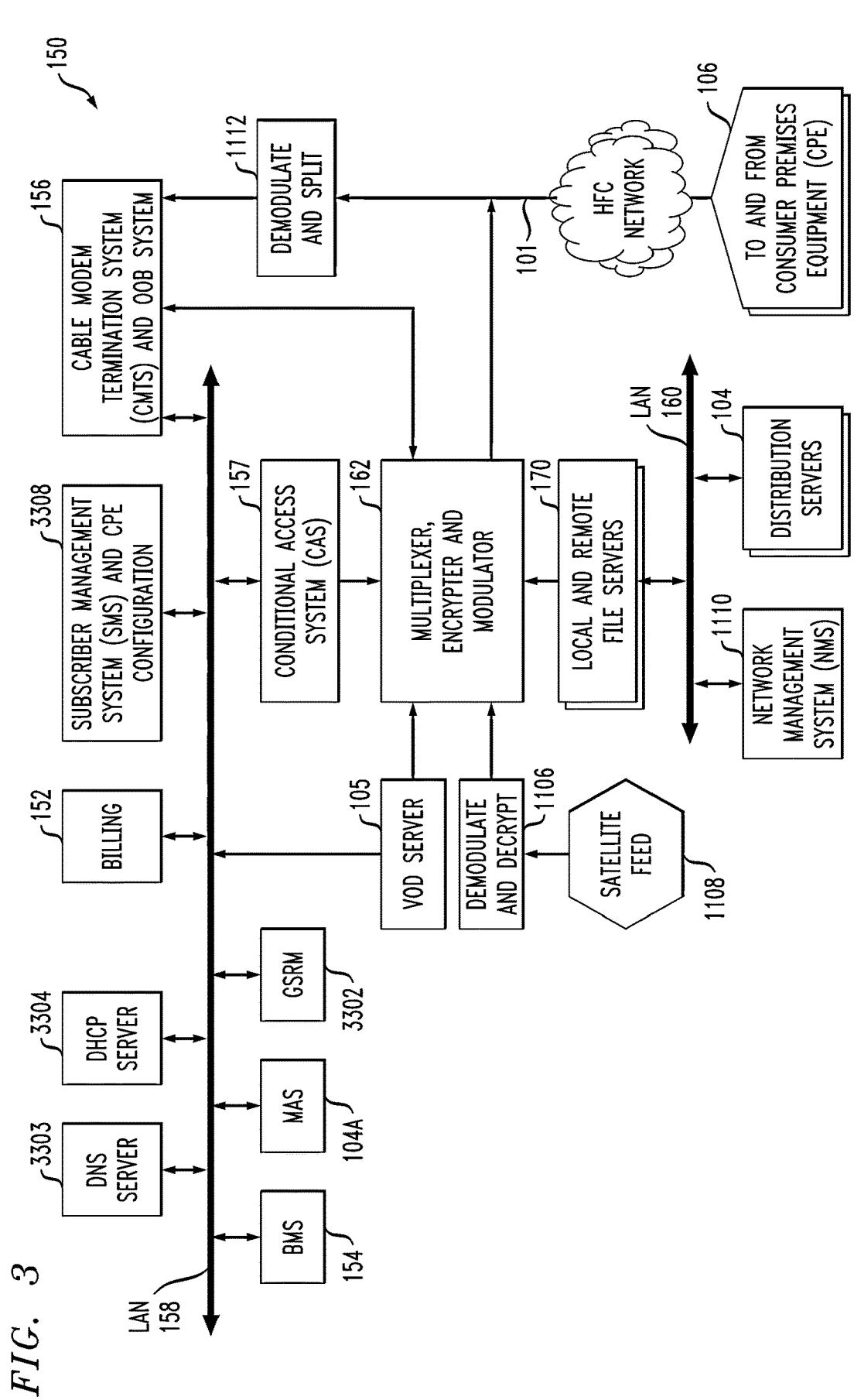
FIG. 3 is a functional block diagram illustrating one exemplary HFC cable network head-end configuration, useful within the system of FIG. 1.

FIG. 3 is a functional block diagram illustrating one exemplary HFC cable network head-end configuration, useful within the system of FIG. 1. As shown in FIG. 3, the head-end architecture 150 comprises typical head-end components and services including billing module 152, subscriber management system (SMS) and CPE configuration management module 3308, cable-modem termination system (CMTS) and out-of-band (OOB) system 156, as well as LAN(s) 158, 160 placing the various components in data communication with one another. In one or more embodiments, there are multiple CMTSs. Each may be coupled to an HER 1091, for example. See, e.g., FIGS. 1 and 2 of co-assigned U.S. Pat. No. 7,792,963 of inventors Gould and Danforth, entitled METHOD TO BLOCK UNAUTHORIZED NETWORK TRAFFIC IN A CABLE DATA NETWORK, the complete disclosure of which is expressly incorporated herein by reference in its entirety for all purposes.

It will be appreciated that while a bar or bus LAN topology is illustrated, any number of other arrangements (e.g., ring, star, etc.) may be used consistent with the invention. It will also be appreciated that the head-end configuration depicted in FIG. 3 is high-level, conceptual architecture and that each multi-service operator (MSO) may have multiple head-ends deployed using custom architectures.

The architecture 150 of FIG. 3 further includes a multiplexer/encrypter/modulator (MEM) 162 coupled to the HFC network 101 adapted to "condition" content for transmission over the network. The distribution servers 104 are coupled to the LAN 160, which provides access to the MEM 162 and network 101 via one or more file servers 170. The VOD servers 105 are coupled to the LAN 158, although other architectures may be employed (such as for example where the VOD servers are associated with a core switching device such as an 802.3z Gigabit Ethernet device; or the VOD servers could be coupled to LAN 160). Since information is typically carried across multiple channels, the head-end should be adapted to acquire the information for the carried channels from various sources. Typically, the channels being delivered from the head-end 150 to the CPE 106 ("downstream") are multiplexed together in the head-end and sent to neighborhood hubs (refer to description of FIG. 4) via a variety of interposed network components.

Content (e.g., audio, video, etc.) is provided in each downstream (in-band) channel associated with the relevant service group. (Note that in the context of data communications, internet data is passed both downstream and upstream.) To communicate with the head-end or intermediary node (e.g., hub server), the CPE 106 may use the out-of-band (OOB) or DOCSIS® (Data Over Cable Service Interface Specification) channels (registered mark of Cable Television Laboratories, Inc., 400 Centennial Parkway Louisville CO 80027, USA) and associated protocols (e.g., DOCSIS 1.x, 2.0. or 3.0). The OpenCable™ Application Platform (OCAP) 1.0, 2.0, 3.0 (and subsequent) specification (Cable Television laboratories Inc.) provides for exemplary networking protocols both downstream and upstream, although the invention is in no way limited to these approaches. All versions of the DOCSIS and OCAP specifications are expressly incorporated herein by reference in their entireties for all purposes.

Furthermore in this regard, DOCSIS is an international telecommunications standard that permits the addition of high-speed data transfer to an existing cable TV (CATV) system. It is employed by many cable television operators to provide Internet access (cable Internet) over their existing hybrid fiber-coaxial (HFC) infrastructure. HFC systems using DOCSIS to transmit data are one non-limiting exemplary application context for one or more embodiments. However, one or more embodiments are applicable to a variety of different kinds of networks.

It is also worth noting that the use of DOCSIS Provisioning of EPON (Ethernet over Passive Optical Network) or "DPoE" (Specifications available from CableLabs, Louisville, CO, USA) enables the transmission of high-speed data over PONs using DOCSIS back-office systems and processes.

It will also be recognized that multiple servers (broadcast, VOD, or otherwise) can be used, and disposed at two or more different locations if desired, such as being part of different server "farms". These multiple servers can be used to feed one service group, or alternatively different service groups. In a simple architecture, a single server is used to feed one or more service groups. In another variant, multiple servers located at the same location are used to feed one or more service groups. In yet another variant, multiple servers disposed at different location are used to feed one or more service groups.

In some instances, material may also be obtained from a satellite feed 1108; such material is demodulated and decrypted in block 1106 and fed to block 162. Conditional access system 157 may be provided for access control purposes. Network management system 1110 may provide appropriate management functions. Note also that signals from MEM 162 and upstream signals from network 101 that have been demodulated and split in block 1112 are fed to CMTS and OOB system 156.

Also included in FIG. 3 are a global session resource manager (GSRM) 3302, a Mystro Application Server 104A, and a business management system 154, all of which are coupled to LAN 158. GSRM 3302 is one specific form of a DBWAD 1001 and is a non-limiting example of a session resource manager.

An ISP DNS server could be located in the head-end as shown at 3303, but it can also be located in a variety of other places. One or more Dynamic Host Configuration Protocol (DHCP) server(s) 3304 can also be located where shown or in different locations.

It will be appreciated that FIG. 3 depicts a "classic" head end architecture. Currently, in many systems, various elements can be pulled out of the head end and moved to other geographically disparate areas such as national data centers 1098, regional data centers 1048, hub sites, and the like. For example, in some modern systems, satellite feeds 1108 can be relocated to two national sites where many feeds are captured and distributed across a national backbone to regional areas, metro areas, and customers' homes. In another aspect, the CMTS 156 is typically being pushed closer to customers in more modern systems. The skilled artisan will thus appreciate that every head end need not necessarily have every element in FIG. 3, and that in modern cable plants, at least a portion of the functionality depicted in FIG. 3 may be geographically dispersed.

Figure 4:
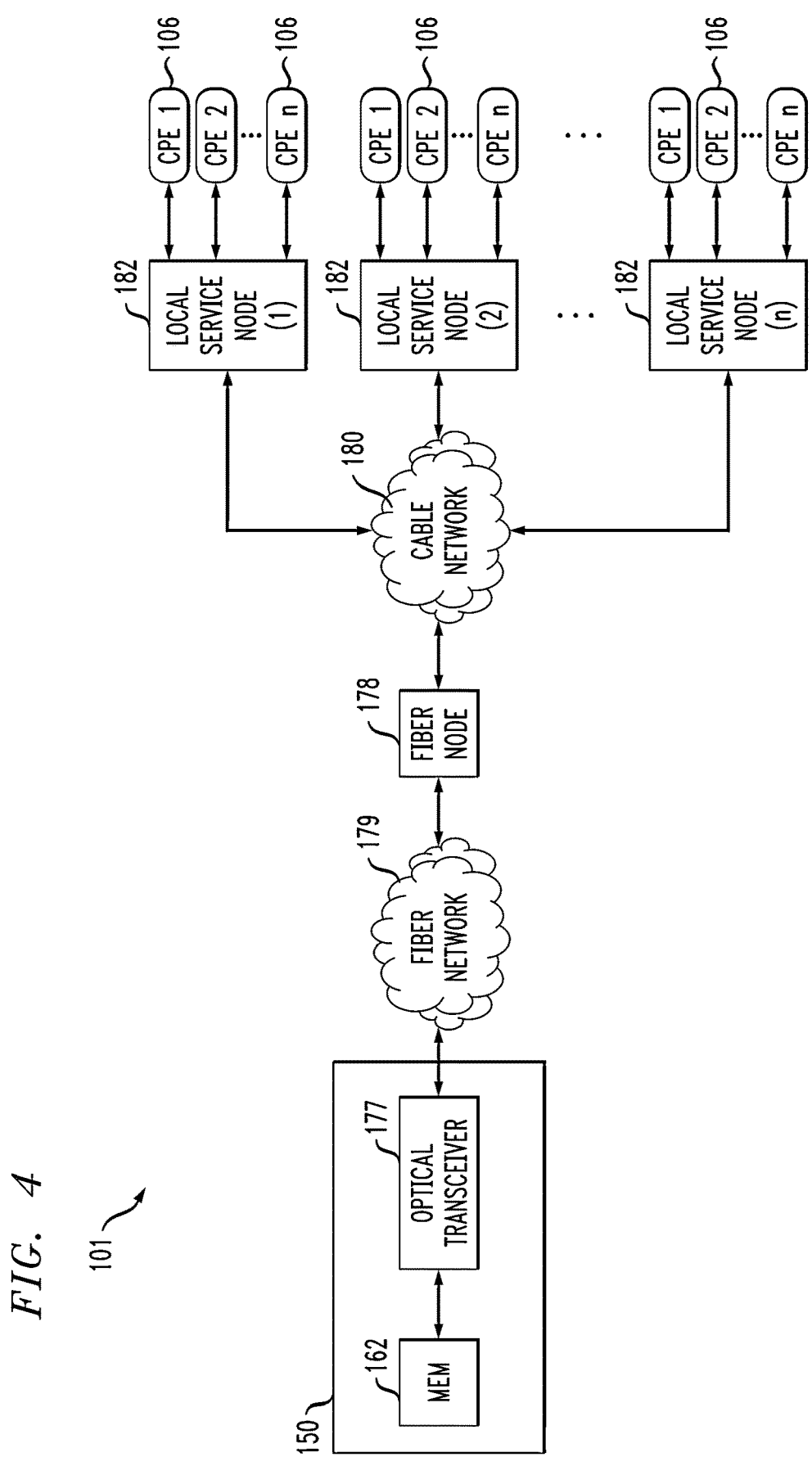
FIG. 4 is a functional block diagram illustrating one exemplary local service node configuration useful within the system of FIG. 1.

As shown in FIG. 4, the network 101 of FIGS. 2 and 3 comprises a fiber/coax arrangement wherein the output of the MEM 162 of FIG. 3 is transferred to the optical domain (such as via an optical transceiver 177 at the head-end 150 or further downstream). The optical domain signals are then distributed over a fiber network 179 to a fiber node 178, which further distributes the signals over a distribution network 180 (typically coax) to a plurality of local servicing nodes 182. This provides an effective 1-to-N expansion of the network at the local service end. Each node 182 services a number of CPEs 106. Further reference may be had to US Patent Publication 2007/0217436 of Markley et al., entitled "Methods and apparatus for centralized content and data delivery," the complete disclosure of which is expressly incorporated herein by reference in its entirety for all purposes. In one or more embodiments, the CPE 106 includes a cable modem, such as a DOCSIS-compliant cable modem (DCCM). Please note that the number n of CPE 106 per node 182 may be different than the number n of nodes 182, and that different nodes may service different numbers n of CPE.

Certain additional aspects of video or other content delivery will now be discussed. It should be understood that embodiments of the invention have broad applicability to a variety of different types of networks. US Patent Publication 2003-0056217 of Paul D. Brooks, entitled "Technique for Effectively Providing Program Material in a Cable Television System," the complete disclosure of which is expressly incorporated herein by reference for all purposes, describes one exemplary broadcast switched digital architecture, although it will be recognized by those of ordinary skill that other approaches and architectures may be substituted. In a cable television system in accordance with the Brooks invention, program materials are made available to subscribers in a neighborhood on an as-needed basis. Specifically, when a subscriber at a set-top terminal selects a program channel to watch, the selection request is transmitted to a head end of the system. In response to such a request, a controller in the head end determines whether the material of the selected program channel has been made available to the neighborhood. If it has been made available, the controller identifies to the set-top terminal the carrier which is carrying the requested program material, and to which the set-top terminal tunes to obtain the requested program material. Otherwise, the controller assigns an unused carrier to carry the requested program material, and informs the set-top terminal of the identity of the newly assigned carrier. The controller also retires those carriers assigned for the program channels which are no longer watched by the subscribers in the neighborhood. Note that reference is made herein, for brevity, to features of the "Brooks invention"—it should be understood that no inference should be drawn that such features are necessarily present in all claimed embodiments of Brooks. The Brooks invention is directed to a technique for utilizing limited network bandwidth to distribute program materials to subscribers in a community access television (CATV) system. In accordance with the Brooks invention, the CATV system makes available to subscribers selected program channels, as opposed to all of the program channels furnished by the system as in prior art. In the Brooks CATV system, the program channels are provided on an as needed basis, and are selected to serve the subscribers in the same neighborhood requesting those channels.

US Patent Publication 2010-0313236 of Albert Straub, entitled "TECHNIQUES FOR UPGRADING SOFTWARE IN A VIDEO CONTENT NETWORK," the complete disclosure of which is expressly incorporated herein by reference for all purposes, provides additional details on the aforementioned dynamic bandwidth allocation device 1001.

US Patent Publication 2009-0248794 of William L. Helms, entitled "SYSTEM AND METHOD FOR CONTENT SHARING," the complete disclosure of which is expressly incorporated herein by reference for all purposes, provides additional details on CPE in the form of a converged premises gateway device. Related aspects are also disclosed in US Patent Publication 2007-0217436 of Markley et al, entitled "METHODS AND APPARATUS FOR CENTRALIZED CONTENT AND DATA DELIVERY," the complete disclosure of which is expressly incorporated herein by reference for all purposes.

Figure 5:
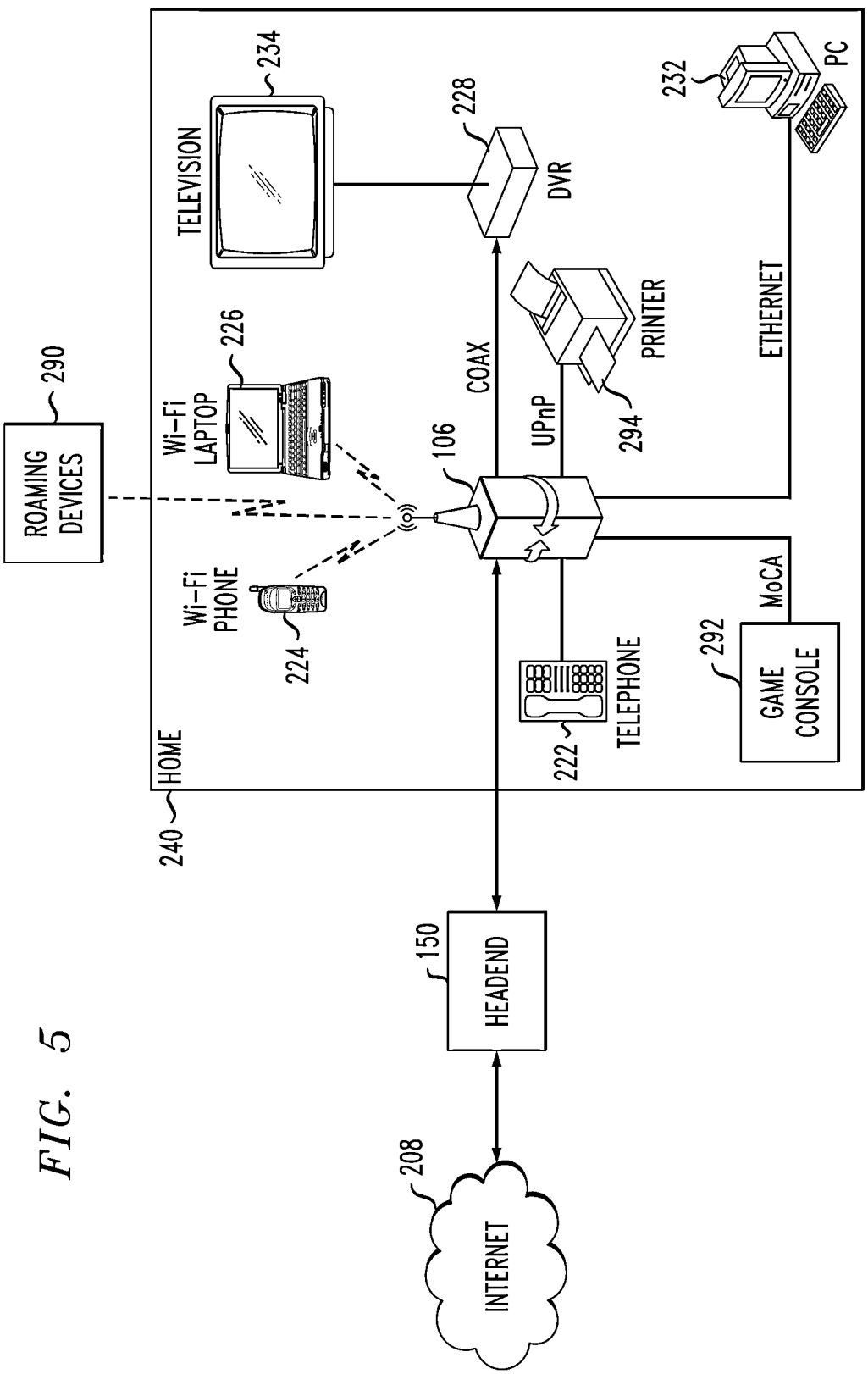
FIG. 5 is a functional block diagram of a premises network, including an exemplary centralized customer premises equipment (CPE) unit, interfacing with a head end such as that of FIG. 3.
Figure 6:
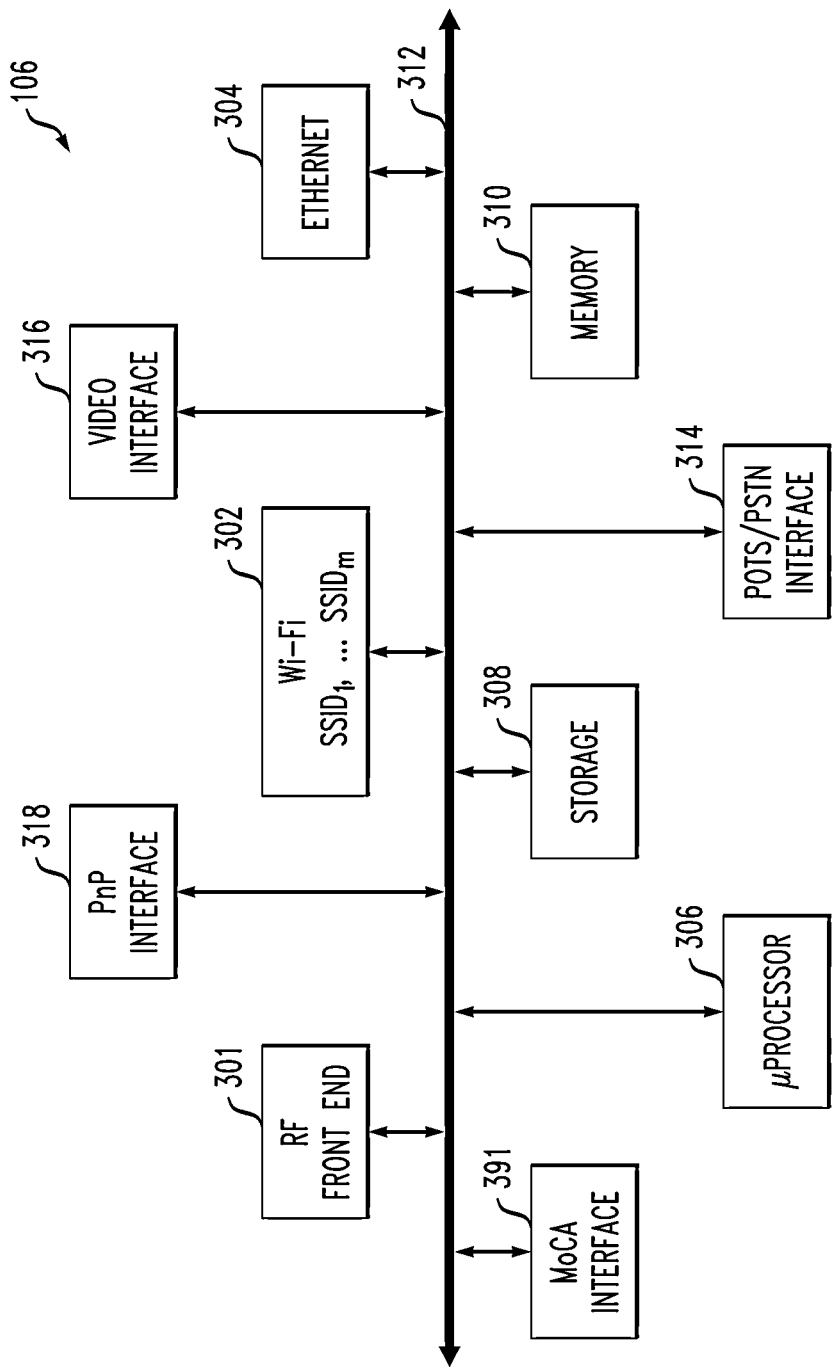
FIG. 6 is a functional block diagram of an exemplary centralized CPE unit, useful within the system of FIG. 1.

Reference should now be had to FIG. 5, which presents a block diagram of a premises network interfacing with a head end of an MSO or the like, providing Internet access. An exemplary advanced wireless gateway comprising CPE 106 is depicted as well. It is to be emphasized that the specific form of CPE 106 shown in FIGS. 5 and 6 is exemplary and non-limiting, and shows a number of optional features. Many other types of CPE can be employed in one or more embodiments; for example, a cable modem, DSL modem, and the like. The CPE can also be a Service Optical Network Unit (S-ONU) for FTTH deployment—see FIGS. 8 and 9 and accompanying text.

CPE 106 includes an advanced wireless gateway which connects to a head end 150 or other hub of a network, such as a video content network of an MSO or the like. The head end is coupled also to an internet (e.g., the Internet) 208 which is located external to the head end 150, such as via an Internet (IP) backbone or gateway (not shown).

The head end is in the illustrated embodiment coupled to multiple households or other premises, including the exemplary illustrated household 240. In particular, the head end (for example, a cable modem termination system 156 thereof) is coupled via the aforementioned HFC network and local coaxial cable or fiber drop to the premises, including the consumer premises equipment (CPE) 106. The exemplary CPE 106 is in signal communication with any number of different devices including, e.g., a wired telephony unit 222, a Wi-Fi or other wireless-enabled phone 224, a Wi-Fi or other wireless-enabled laptop 226, a session initiation protocol (SIP) phone, an H.323 terminal or gateway, etc. Additionally, the CPE 106 is also coupled to a digital video recorder (DVR) 228 (e.g., over coax), in turn coupled to television 234 via a wired or wireless interface (e.g., cabling, PAN or 802.15 UWB micro-net, etc.). CPE 106 is also in communication with a network (here, an Ethernet network compliant with IEEE Std. 802.3, although any number of other network protocols and topologies could be used) on which is a personal computer (PC) 232.

Other non-limiting exemplary devices that CPE 106 may communicate with include a printer 294; for example, over a universal plug and play (UPnP) interface, and/or a game console 292; for example, over a multimedia over coax alliance (MoCA) interface.

In some instances, CPE 106 is also in signal communication with one or more roaming devices, generally represented by block 290.

A "home LAN" (HLAN) is created in the exemplary embodiment, which may include for example the network formed over the installed coaxial cabling in the premises, the Wi-Fi network, and so forth.

During operation, the CPE 106 exchanges signals with the head end over the interposed coax (and/or other, e.g., fiber) bearer medium. The signals include e.g., Internet traffic (IPv4 or IPv6), digital programming and other digital signaling or content such as digital (packet-based; e.g., VoIP) telephone service. The CPE 106 then exchanges this digital information after demodulation and any decryption (and any demultiplexing) to the particular system(s) to which it is directed or addressed. For example, in one embodiment, a MAC address or IP address can be used as the basis of directing traffic within the client-side environment 240.

Any number of different data flows may occur within the network depicted in FIG. 5. For example, the CPE 106 may exchange digital telephone signals from the head end which are further exchanged with the telephone unit 222, the Wi-Fi phone 224, or one or more roaming devices 290. The digital telephone signals may be IP-based such as Voice-over-IP (VoIP), or may utilize another protocol or transport mechanism. The well-known session initiation protocol (SIP) may be used, for example, in the context of a "SIP phone" for making multi-media calls. The network may also interface with a cellular or other wireless system, such as for example a 3G IMS (IP multimedia subsystem) system, in order to provide multimedia calls between a user or consumer in the household domain 240 (e.g., using a SIP phone or H.323 terminal) and a mobile 3G telephone or personal media device (PMD) user via that user's radio access network (RAN).

The CPE 106 may also exchange Internet traffic (e.g., TCP/IP and other packets) with the head end 150 which is further exchanged with the Wi-Fi laptop 226, the PC 232, one or more roaming devices 290, or other device. CPE 106 may also receive digital programming that is forwarded to the DVR 228 or to the television 234. Programming requests and other control information may be received by the CPE 106 and forwarded to the head end as well for appropriate handling.

FIG. 6 is a block diagram of one exemplary embodiment of the CPE 106 of FIG. 5. The exemplary CPE 106 includes an RF front end 301, Wi-Fi interface 302, video interface 316, "Plug n' Play" (PnP) interface 318 (for example, a UPnP interface) and Ethernet interface 304, each directly or indirectly coupled to a bus 312. In some cases, Wi-Fi interface 302 comprises a single wireless access point (WAP) running multiple ("m") service set identifiers (SSIDs). In some cases, multiple SSIDs, which could represent different applications, are served from a common WAP. For example, SSID 1 is for the home user, while SSID 2 may be for a managed security service, SSID 3 may be a managed home networking service, SSID 4 may be a hot spot, and so on. Each of these is on a separate IP subnetwork for security, accounting, and policy reasons. The microprocessor 306, storage unit 308, plain old telephone service (POTS)/public switched telephone network (PSTN) interface 314, and memory unit 310 are also coupled to the exemplary bus 312, as is a suitable MoCA interface 391. The memory unit 310 typically comprises a random-access memory (RAM) and storage unit 308 typically comprises a hard disk drive, an optical drive (e.g., CD-ROM or DVD), NAND flash memory, RAID (redundant array of inexpensive disks) configuration, or some combination thereof.

The illustrated CPE 106 can assume literally any discrete form factor, including those adapted for desktop, floor-standing, or wall-mounted use, or alternatively may be integrated in whole or part (e.g., on a common functional basis) with other devices if desired.

Again, it is to be emphasized that every embodiment need not necessarily have all the elements shown in FIG. 6—as noted, the specific form of CPE 106 shown in FIGS. 5 and 6 is exemplary and non-limiting, and shows a number of optional features. Yet again, many other types of CPE can be employed in one or more embodiments; for example, a cable modem, DSL modem, and the like.

It will be recognized that while a linear or centralized bus architecture is shown as the basis of the exemplary embodiment of FIG. 6, other bus architectures and topologies may be used. For example, a distributed or multi-stage bus architecture may be employed. Similarly, a "fabric" or other mechanism (e.g., crossbar switch, RAPIDIO interface, non-blocking matrix, TDMA or multiplexed system, etc.) may be used as the basis of at least some of the internal bus communications within the device. Furthermore, many if not all of the foregoing functions may be integrated into one or more integrated circuit (IC) devices in the form of an ASIC or "system-on-a-chip" (SoC). Myriad other architectures well known to those in the data processing and computer arts may accordingly be employed.

Yet again, it will also be recognized that the CPE configuration shown is essentially for illustrative purposes, and various other configurations of the CPE 106 are consistent with other embodiments of the invention. For example, the CPE 106 in FIG. 6 may not include all of the elements shown, and/or may include additional elements and interfaces such as for example an interface for the HomePlug A/V standard which transmits digital data over power lines, a PAN (e.g., 802.15), Bluetooth, or other short-range wireless interface for localized data communication, etc.

A suitable number of standard 10/100/1000 Base T Ethernet ports for the purpose of a Home LAN connection are provided in the exemplary device of FIG. 6; however, it will be appreciated that other rates (e.g., Gigabit Ethernet or 10-Gig-E) and local networking protocols (e.g., MoCA, USB, etc.) may be used. These interfaces may be serviced via a WLAN interface, wired RJ-45 ports, or otherwise. The CPE 106 can also include a plurality of RJ-11 ports for telephony interface, as well as a plurality of USB (e.g., USB 2.0) ports, and IEEE-1394 (Firewire) ports. S-video and other signal interfaces may also be provided if desired.

During operation of the CPE 106, software located in the storage unit 308 is run on the microprocessor 306 using the memory unit 310 (e.g., a program memory within or external to the microprocessor). The software controls the operation of the other components of the system, and provides various other functions within the CPE. Other system software/firmware may also be externally reprogrammed, such as using a download and reprogramming of the contents of the flash memory, replacement of files on the storage device or within other non-volatile storage, etc. This allows for remote reprogramming or reconfiguration of the CPE 106 by the MSO or other network agent.

It should be noted that some embodiments provide a cloud-based user interface, wherein CPE 106 accesses a user interface on a server in the cloud, such as in NDC 1098.

The RF front end 301 of the exemplary embodiment comprises a cable modem of the type known in the art. In some cases, the CPE just includes the cable modem and omits the optional features. Content or data normally streamed over the cable modem can be received and distributed by the CPE 106, such as for example packetized video (e.g., IPTV). The digital data exchanged using RF front end 301 includes IP or other packetized protocol traffic that provides access to internet service. As is well known in cable modem technology, such data may be streamed over one or more dedicated QAMs resident on the HFC bearer medium, or even multiplexed or otherwise combined with QAMs allocated for content delivery, etc. The packetized (e.g., IP) traffic received by the CPE 106 may then be exchanged with other digital systems in the local environment 240 (or outside this environment by way of a gateway or portal) via, e.g., the Wi-Fi interface 302, Ethernet interface 304 or plug-and-play (PnP) interface 318.

Additionally, the RF front end 301 modulates, encrypts/multiplexes as required, and transmits digital information for receipt by upstream entities such as the CMTS or a network server. Digital data transmitted via the RF front end 301 may include, for example, MPEG-2 encoded programming data that is forwarded to a television monitor via the video interface 316. Programming data may also be stored on the CPE storage unit 308 for later distribution by way of the video interface 316, or using the Wi-Fi interface 302, Ethernet interface 304, Firewire (IEEE Std. 1394), USB/USB2, or any number of other such options.

Other devices such as portable music players (e.g., MP3 audio players) may be coupled to the CPE 106 via any number of different interfaces, and music and other media files downloaded for portable use and viewing.

In some instances, the CPE 106 includes a DOCSIS cable modem for delivery of traditional broadband Internet services. This connection can be shared by all Internet devices in the premises 240; e.g., Internet protocol television (IPTV) devices, PCs, laptops, etc., as well as by roaming devices 290. In addition, the CPE 106 can be remotely managed (such as from the head end 150, or another remote network agent) to support appropriate IP services. Some embodiments could utilize a cloud-based user interface, wherein CPE 106 accesses a user interface on a server in the cloud, such as in NDC 1098.

In some instances, the CPE 106 also creates a home Local Area Network (LAN) utilizing the existing coaxial cable in the home. For example, an Ethernet-over-coax based technology allows services to be delivered to other devices in the home utilizing a frequency outside (e.g., above) the traditional cable service delivery frequencies. For example, frequencies on the order of 1150 MHz could be used to deliver data and applications to other devices in the home such as PCs, PMDs, media extenders and set-top boxes. The coaxial network is merely the bearer; devices on the network utilize Ethernet or other comparable networking protocols over this bearer.

The exemplary CPE 106 shown in FIGS. 5 and 6 acts as a Wi-Fi access point (AP), thereby allowing Wi-Fi enabled devices to connect to the home network and access Internet, media, and other resources on the network. This functionality can be omitted in one or more embodiments.

In one embodiment, Wi-Fi interface 302 comprises a single wireless access point (WAP) running multiple ("m") service set identifiers (SSIDs). One or more SSIDs can be set aside for the home network while one or more SSIDs can be set aside for roaming devices 290.

A premises gateway software management package (application) is also provided to control, configure, monitor and provision the CPE 106 from the cable head-end 150 or other remote network node via the cable modem (DOCSIS) interface. This control allows a remote user to configure and monitor the CPE 106 and home network. Yet again, it should be noted that some embodiments could employ a cloud-based user interface, wherein CPE 106 accesses a user interface on a server in the cloud, such as in NDC 1098. The MoCA interface 391 can be configured, for example, in accordance with the MoCA 1.0, 1.1, or 2.0 specifications.

As discussed above, the optional Wi-Fi wireless interface 302 is, in some instances, also configured to provide a plurality of unique service set identifiers (SSIDs) simultaneously. These SSIDs are configurable (locally or remotely), such as via a web page.

Figure 8:
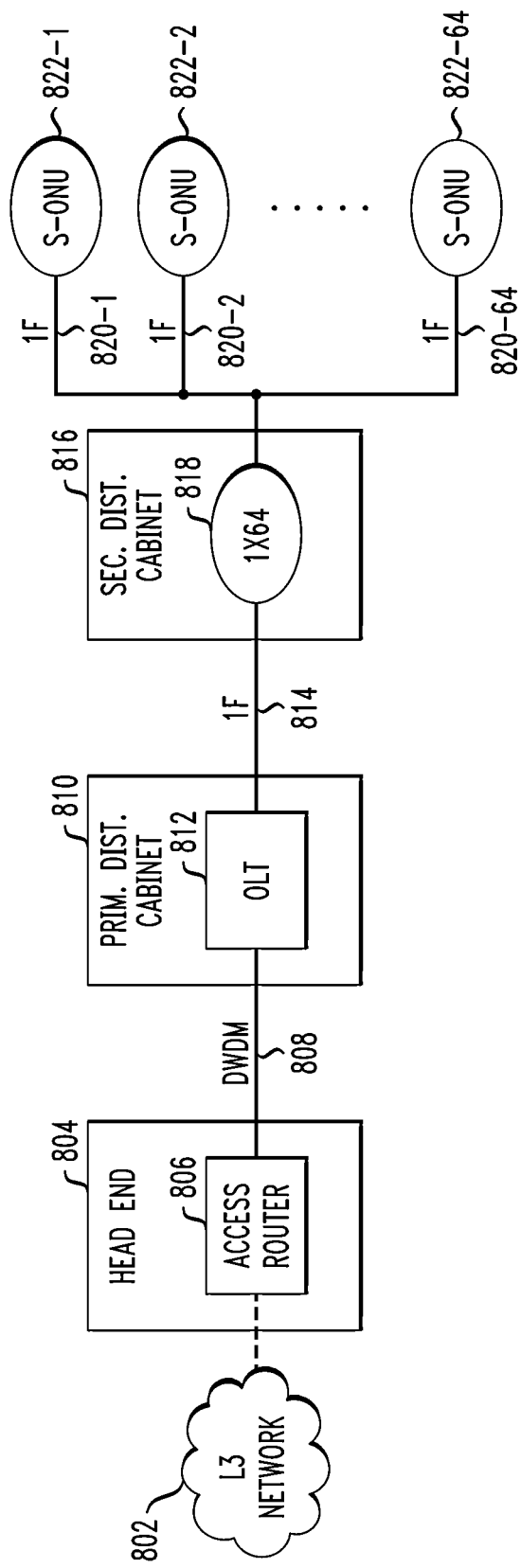
FIG. 8 is a functional block diagram illustrating an exemplary FTTH system, which is one exemplary system within which one or more embodiments could be employed.

As noted, there are also fiber networks for fiber to the home (FTTH) deployments (also known as fiber to the premises or FTTP), where the CPE is a Service ONU (S-ONU; ONU=optical network unit). Referring now to FIG. 8, L3 network 802 generally represents the elements in FIG. 1 upstream of the head ends 150, while head end 804, including access router 806, is an alternative form of head end that can be used in lieu of or in addition to head ends 150 in one or more embodiments. Head end 804 is suitable for FTTH implementations. Access router 806 of head end 804 is coupled to optical line terminal 812 in primary distribution cabinet 810 via dense wavelength division multiplexing (DWDM) network 808. Single fiber coupling 814 is then provided to a 1:64 splitter 818 in secondary distribution cabinet 816 which provides a 64:1 expansion to sixty-four S-ONUs 822-1 through 822-64 (in multiple premises) via sixty-four single fibers 820-1 through 820-64, it being understood that a different ratio splitter could be used in other embodiments and/or that not all of the 64 (or other number of) outlet ports are necessarily connected to an S-ONU.

Figure 9:
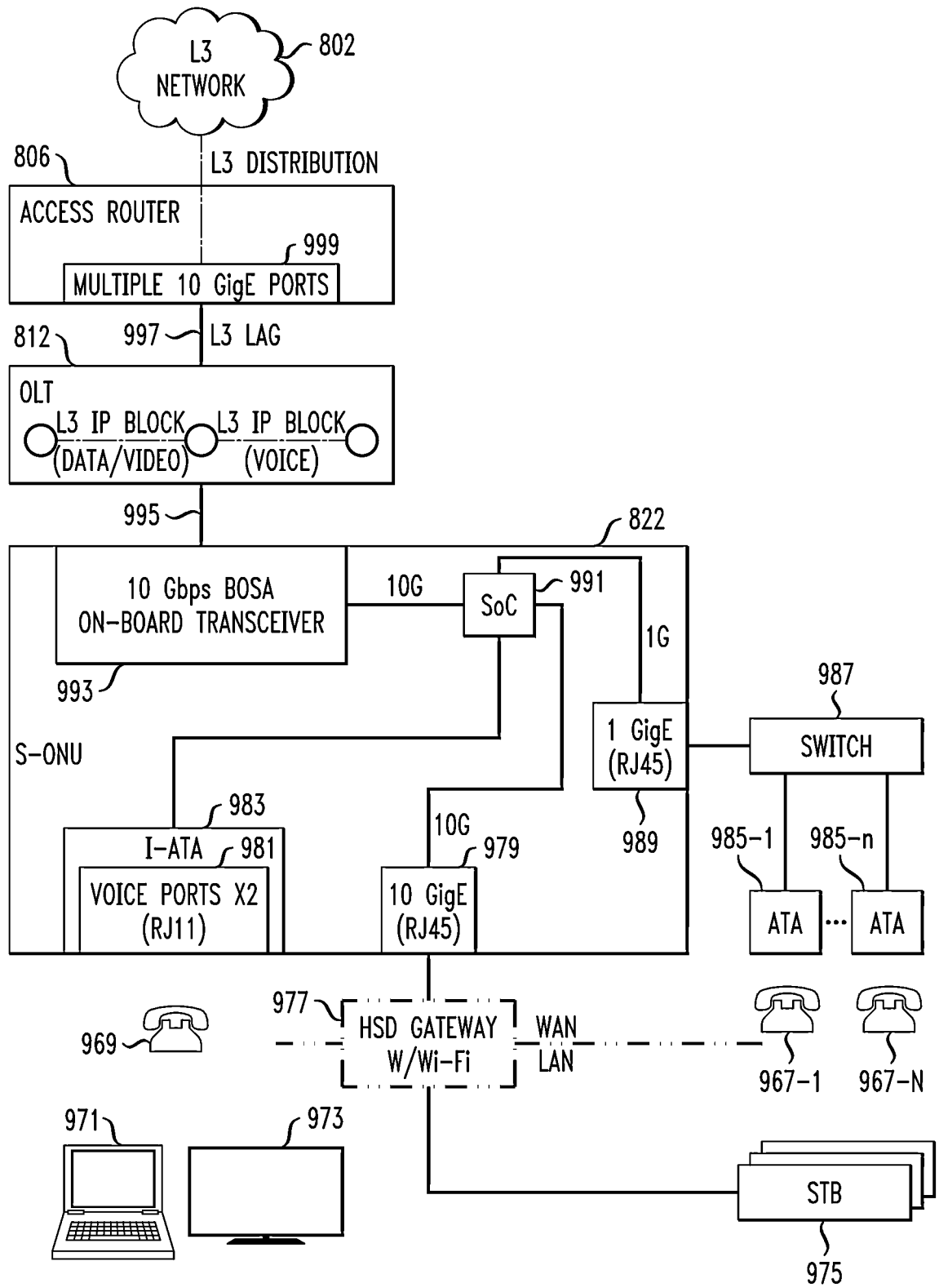
FIG. 9 is a functional block diagram of an exemplary centralized S-ONU CPE unit interfacing with the system of FIG. 8.

Giving attention now to FIG. 9, wherein elements similar to those in FIG. 8 have been given the same reference number, access router 806 is provided with multiple ten-Gigabit Ethernet ports 999 and is coupled to OLT 812 via L3 (layer 3) link aggregation group (LAG) 997. OLT 812 can include an L3 IP block for data and video, and another L3 IP block for voice, for example. In a non-limiting example, S-ONU 822 includes a 10 Gbps bi-directional optical subassembly (BOSA) on-board transceiver 993 with a 10G connection to system-on-chip (SoC) 991. SoC 991 is coupled to a 10 Gigabit Ethernet RJ45 port 979, to which a high-speed data gateway 977 with Wi-Fi capability is connected via category 5E cable. Gateway 977 is coupled to one or more set-top boxes 975 via category 5e, and effectively serves as a wide area network (WAN) to local area network (LAN) gateway. Wireless and/or wired connections can be provided to devices such as laptops 971, televisions 973, and the like, in a known manner. Appropriate telephonic capability can be provided. In a non-limiting example, residential customers are provided with an internal integrated voice gateway (I-ATA or internal analog telephone adapter) 983 coupled to SoC 991, with two RJ11 voice ports 981 to which up to two analog telephones 969 can be connected. Furthermore, in a non-limiting example, business customers are further provided with a 1 Gigabit Ethernet RJ45 port 989 coupled to SoC 991, to which switch 987 is coupled via Category 5e cable. Switch 987 provides connectivity for a desired number n (typically more than two) of analog telephones 967-1 through 967-n, suitable for the needs of the business, via external analog telephone adapters (ATAs) 985-1 through 985-n. The parameter "n" in FIG. 9 is not necessarily the same as the parameter "n" in other figures, but rather generally represents a desired number of units. Connection 995 can be, for example, via SMF (single-mode optical fiber).

In addition to "broadcast" content (e.g., video programming), the systems of FIGS. 1-6, 8, and 9 can, if desired, also deliver Internet data services using the Internet protocol (IP), although other protocols and transport mechanisms of the type well known in the digital communication art may be substituted. In the systems of FIGS. 1-6, the IP packets are typically transmitted on RF channels that are different that the RF channels used for the broadcast video and audio programming, although this is not a requirement. The CPE 106 are each configured to monitor the particular assigned RF channel (such as via a port or socket ID/address, or other such mechanism) for IP packets intended for the subscriber premises/address that they serve.

Principles of the present disclosure will be described herein in the context of detecting and localizing cable plant impairments using full band capture spectrum analysis. It is to be appreciated, however, that the specific apparatus and/or methods illustratively shown and described herein are to be considered exemplary as opposed to limiting. Moreover, it will become apparent to those skilled in the art given the teachings herein that numerous modifications can be made to the embodiments shown that are within the scope of the appended claims. That is, no limitations with respect to the embodiments shown and described herein are intended or should be inferred.

As noted, network operators, such as cable providers (e.g., cable multi-system operators or MSOs) need to quickly identify network issues and route maintenance efforts. Currently, this is typically based on customer calls or out-of-specification telemetry data. Cable networks typically include, in the customer's premises, cable modems (e.g., in CPE 106). Recently, additional functionality has been introduced to these modems, including Proactive Network Maintenance (PNM) and Full Band Capture (FBC). Since FBC is relatively new, little has so far been done with it. One or more embodiments advantageously provide techniques to capture the spectrum from the cable modem, pattern match against known impairment types, and geographically cluster the impairments to identify likely fault locations within the cable plant. With this information, technicians can be dispatched to the location to validate and repair the issue. This proactive maintenance activity leads to a healthier cable plant and fewer trouble calls.

The skilled artisan will be familiar with PNM from, for example, DOCSIS® Best Practices and Guidelines, PNM Best Practices: HFC Networks (DOCSIS 3.0), CM-GL-PNMP-V03-160725, Cable Television Laboratories, Inc. 2010-2016, 07/25/16, expressly incorporated herein by reference in its entirety for all purposes. The skilled artisan will be familiar with FBC from, for example, the preceding document as well as Data-Over-Cable Service Interface Specifications DOCSIS® 4.0, Cable Modem Operations Support System Interface Specification, CM-OSSIv4.0-I02-200311, Cable Television Laboratories, Inc., 2019-2020, 03/11/20, expressly incorporated herein by reference in its entirety for all purposes, and Data-Over-Cable Service Interface Specifications DOCSIS® 3.1, Cable Modem Operations Support System Interface Specification, CM-SP-CM-OSSIv3.1-I18-201022, Cable Television Laboratories, Inc., 2014-2020, 10/22/20, also expressly incorporated herein by reference in its entirety for all purposes. CM-GL-PNMP-V03-160725 explains, inter alia, the "raw" method of acquiring spectral readings from cable modems.

Figure 10:
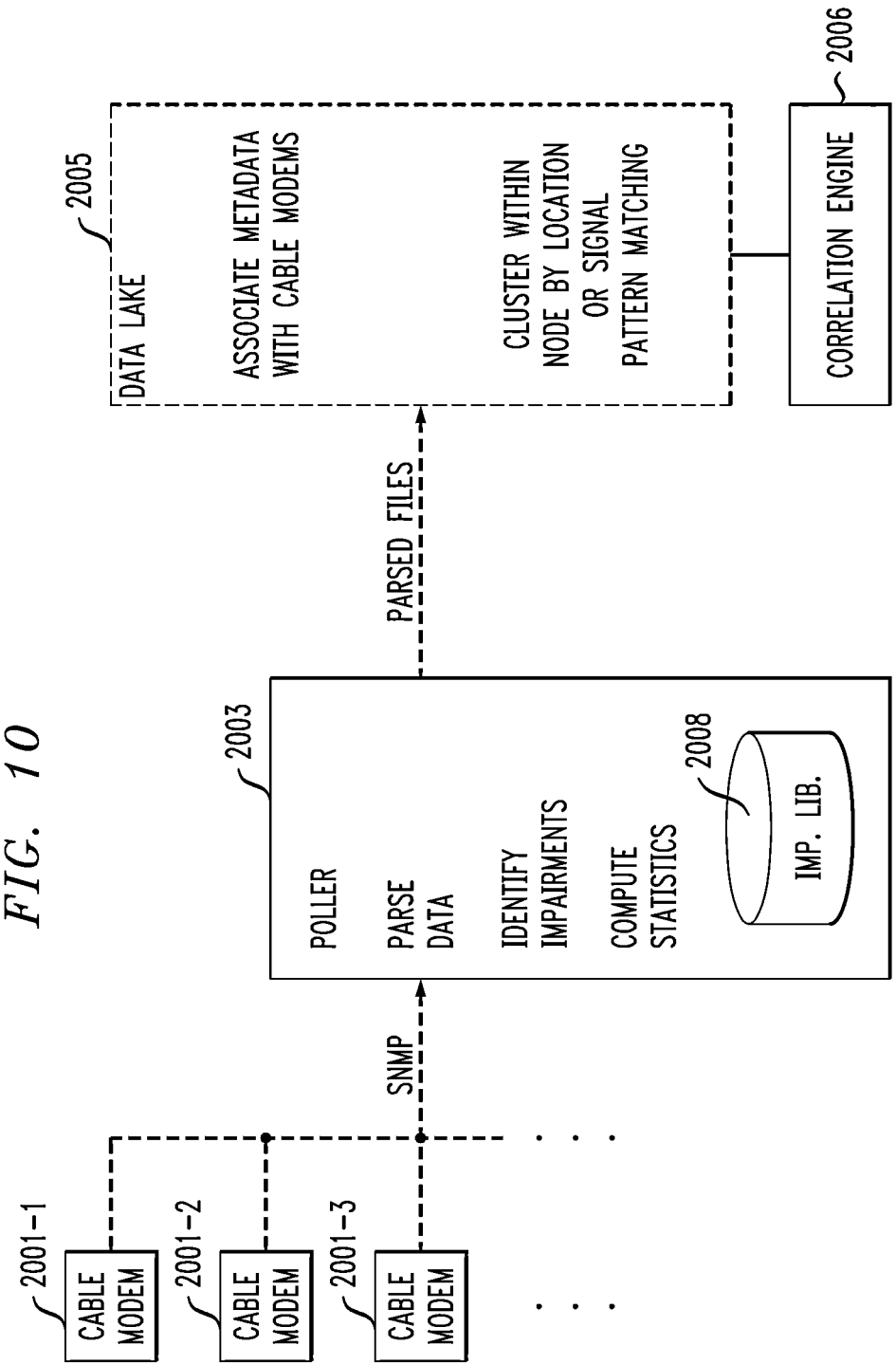
FIG. 10 is a high-level block diagram of an embodiment of a system, in accordance with an aspect of the invention.

Referring to FIG. 10, in one or more embodiments, using simple network management protocol (SNMP), parameters are set for the FBC scan and the scan is triggered. The spectrum data from the FBC scan is retrieved from the cable modems 2001-1, 2001-2, 2001-3, . . . . Once the data is on the polling host 2003, it is parsed, smoothed, cleaned, and various statistical measurements are taken. A list of predefined impairments is iterated over, and each one is compared to the scan by sliding a window over the spectrum. If there is a match, it is denoted with the frequency start/stop and severity. This data is sent back to a central cluster 2005 for further processing.

On the cluster, the spectrum data is stored in a way that provides fast access to individual scans by indexing the list of scans for an individual cable modem, its impairments, and its location on the file system within the containing file. Additionally, the individual impairments as well as the geographic coordinates from the account that owns the cable modem are stored in a database that provides geographic query functionality. The table housing this data is queried to produce clusters of accounts within the same node presenting the same impairment. These clusters are mapped and compared to plant data to present likely locations for directed plant maintenance.

Still considering FIG. 10, and referring back also again to FIG. 3, polling server 2003 can, in some instances, be located as a peer to the CMTS 156 in FIG. 3; i.e., adjacent to 156 on LAN 158. It will be understood that this is an exemplary implementation in the context of a traditional head end and in modern implementations the elements are not necessarily collocated but can be geographically dispersed but networked together. In one or more embodiments the poller is collocated with the CMTS.

One or more embodiments provide techniques to take a complicated data set and put it through a series of analyses that output a specific set of impairments tied to an area. One or more embodiments use a powerful technology called Full Band Capture (FBC), which is available inside modern cable modems. Newer cable modems provide not just the ability to see the RF spectrum being used by that modem, but rather the entire RF spectrum, including those portions allocated to things such as VOD, switched video, and normal QAM video. Full band capture thus permits monitoring more of the cable plant than was previously possible.

One or more embodiments take readings, typically represented graphically, and run them through a set of systems that identify common types of impairments (known impairments) as well as common patterns of impairments (e.g., unidentified common sets of behaviors/impairments; which may or may not actually be an impairment). There are different categories of impairments and different ways to analyze different types of impairments. Cable plant analysis according to the prior art typically deals with simple threshold level analysis; e.g., "this metric is above/below a given threshold." In contrast, one or more embodiments examine the actual shape/pattern of the RF spectrum to determine types of impairments within the spectrum itself.

At a high level, the system works by going out on an interval (e.g., every 6-8 hours) and gathering a full band capture (spectra) of each modem 2001-1, 2001-2, 2001-3, . . . in the cable plant. These can be thought of as shapes of the cable plant spectrum. They are correlated to geographic areas/nodes in the cable plant and run through a set of analyses that identify impairments in the shapes. Examples of impairments include: tilt, notching, standing wave, and the like, each of which are represented graphically on the spectra itself. One or more embodiments look at the spectra programmatically and identify those spectral patterns within a geographic area.

The poller 2003 obtains data back from the cable modems 2001-1, 2001-2, 2001-3, . . . and turns it into the data used to carry out the analysis. Amplitude data comes back from the cable modem, which corresponds to the frequency. One or more embodiments obtain approximately 26,000 values for an individual cable modem, ranging from 80 MHz-1 GHz. One or more embodiments slide a window over the data and look for patterns, using a pattern matching process to identify the impairments. Additional logic is provided in one or more embodiments to carry out geographical clustering. The skilled artisan in the field of signal processing is familiar with the concept of sliding a sampling window over a frequency range.

In one or more embodiments, data is expressed in an industry standard covered by CableLabs. CableLabs provides an access method for obtaining data from the modems 2001-1, 2001-2, 2001-3, . . . . Reference is made to the above discussion of CM-GL-PNMP-V03-160725, CM-OSSIv4.0-I02-200311, and CM-SP-CM-OS SIv3.1-I18-201022.

The poller 2003 includes a list of cable modems that should be queried. The poller 2003 communicates with the cable modems via SNMP (simple network management protocol). The poller asks each cable modem for its make and model and how long it has been on line. Depending on the vendor, there are different device types that require different ways to ask for the data. The poller tells the given cable modem(s) to initiate a trace, and the cable modem(s) start the trace. In one or more embodiments, the poller waits a predetermined amount of time (by way of example and not limitation, about 60 seconds) and then requests the data. Once the data has been received at the poller 2003, in one or more embodiments, the poller undertakes some basic data cleaning (referred to in FIG. 10 as "parse data") to verify that all the data is within specified bounds (by way of example and not limitation, not less than −60 dB or more than 10 dB or other suitable range). Then, the poller 2003 starts reviewing the data to identify impairments.

In some embodiments, initially, start with a check for a filter to make sure that a check is not being conducted for notching in an area that has been filtered. Note, a distinction should be made between filtering in the sense of a legacy filter that has been installed in the field to block certain frequencies associated with certain services, and the filtered delta in FIG. 11 view 3164 as will be discussed further below. Non-limiting examples of impairment types that can be looked for include:

high split,
   resonant peak=echo within the coax,
notching=valley in signal that comes from connection
   point that has been physically pulled apart,
standing wave,
spectrum noise,
adjacency,
unusable low power,
filter,
noise,
spectrum tilt,
(individual channel) tilt.

It is to be emphasized that the above list is exemplary and non-limiting. Furthermore, one advantageous aspect of one or more embodiments is the ability to detect new types of impairments hitherto unrecognized. Water infiltration into the coaxial cable and ingress of frequency modulation (FM) radio signals are non-limiting examples of things that cause certain patterns of impairments. In one or more embodiments, to identify new impairments, initially, predefine an impairment such as adjacency and instruct the system to look for adjacencies in a given area. In one or more embodiments, the system identifies common impairments and prompts the user to provide a label for same. A human operator/subject matter expert (SME) then looks at the system-identified issue and determines whether it is actually a problem, and labels it if possible. Machine learning can be used in one or more embodiments.

Figure 11:
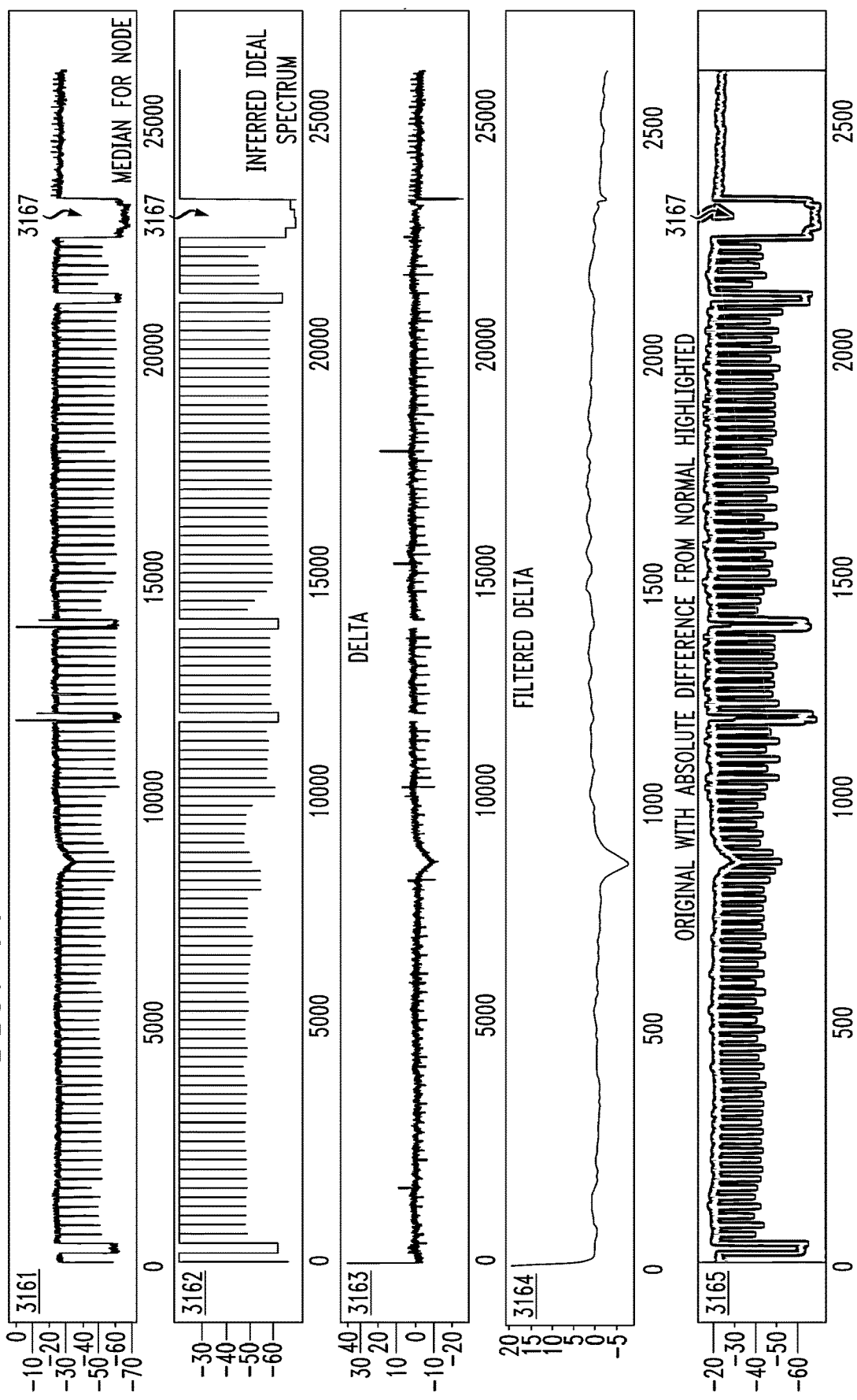
FIG. 11 illustrates an exemplary process of subtracting an ideal spectral reading from an actual spectral reading, with smoothing, in accordance with an aspect of the invention.

Referring now to FIG. 11, one or more embodiments subtract the expected signal from the actual signal to help identify deviation. If strong deviations from the norm are noted and not already identified as a known impairment, in one or more embodiments, the same are flagged for manual monitoring. In one or more embodiments, pull out the data for individual modems 2001-1, 2001-2, 2001-3, . . . and the system identifies that something is "strange," which prompts an SME to look at same and identify/label it. The system identifies that something significant remains when subtracting the expected signal from the actual signal. View 3161 shows the median signal for the node; view 3162 shows the inferred ideal spectrum; view 3163 shows the difference ("delta") between the first and second views; view 3164 shows the filtered delta; and view 3165 shows the original with the absolute difference from normal highlighted. The skilled artisan will be familiar with digital signal processing, digital filter design and implementation, graphical representation of frequency domain signals, and the like; given the teachings herein, the skilled artisan will be able to implement illustrated aspects of the invention using, for example, high-level code, software packages such as MATLAB software (registered mark of The MathWorks, Inc. NATICK MASSACHUSETTS, USA), and the like.

One or more embodiments can employ a library of known impairments (however, one or more embodiments detect unknown impairments, flag them for labeling, and thus build a library of impairments rather than necessarily relying on pre-definition); the system carries out a deviation analysis against an existing trace. The system finds a deviation that does not match a known deviation, and flags same for a human operator to determine whether it is a real problem. If so, the SME is asked to label/name the problem and determine whether the system should look for it in the future. Still referring to FIG. 11, to re-state, the top row 3161 is a trace, the next row 3162 is what the trace should look like, the next row 3163 is the delta (difference between the two), and the next row 3164 is the smoothed/filtered delta (the vertical scale can be enlarged as appropriate). One or more embodiments apply a threshold to see if the smoothed delta exceeds zero by more than the threshold (say 2 dB or 3 db or 5 dB). In one or more embodiments, the system determines whether the absolute value of the smoothed delta is greater than a threshold, and whether there is an existing known impairment over that frequency band. If not, the newly-identified possible impairment is added to a list for manual review. The end goal in one or more embodiments is to have the system identify the impairments and have human SMEs labeling them rather than having human SMEs telling the system a priori what impairments to look for; i.e., the ultimate goal in one or more embodiments is for the system to ask humans to give names to problems the system itself.

Figure 13:
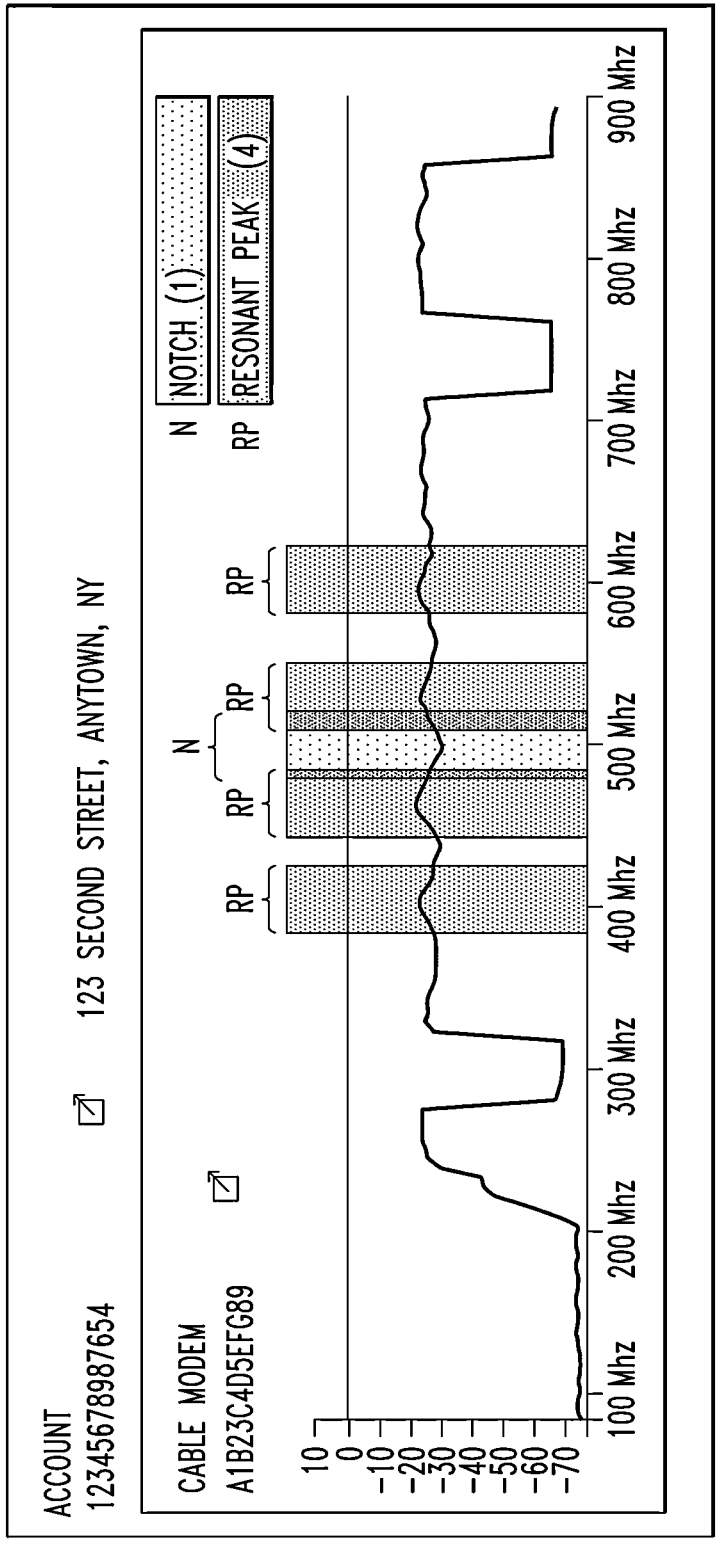
FIG. 13 shows a detailed view of a portion of FIG. 12.

One or more embodiments also break the spectrum out into channels and compute statistics on the channels so they can be analyzed later. The ideal spectrum would be flat. FIG. 13, discussed below, shows, inter alia, details of notching: each notch or valley represents a physical impairment in the plant. The skilled artisan is familiar with notching per se.

Aspects of standing waves, which may be characterized by notches spaced a certain distance apart, are familiar to the skilled artisan. Also shown in FIG. 13 are aspects of resonant peaks. By knowing what account each impairment is associated with (since the cable modem can be tied to the account), impairments can be geographically grouped. The skilled artisan is familiar with standing waves and resonant peaks per se.

Figure 12:
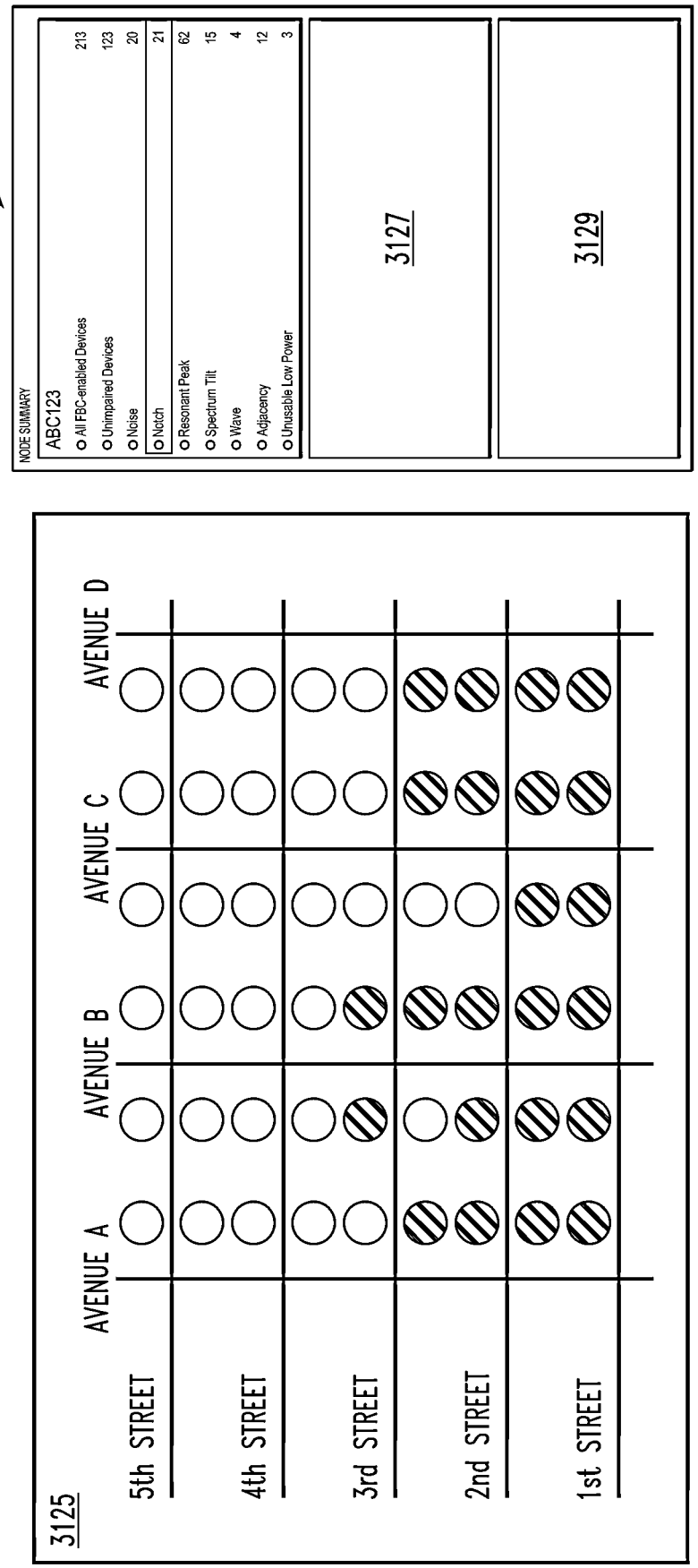
FIG. 12 shows an example of a graphical user interface (GUI) illustrating impairments associated with a node, in accordance with an aspect of the invention.

When the results are presented to the end users (e.g., technicians), they can see that there is a cluster of impairments—in FIG. 12, for example, approximately half of the node is affected. From there, the technician can look at the plant data: one or more embodiments can algorithmically determine what leg the impairment is likely to be on.

FIG. 12 shows a geographical cluster with some premises impacted and some not. FIG. 13 shows examples of a resonant peaks. Technicians can take pictures of actual issues (e.g., loose G-Clips, rodent-chewed cables) as desired and include same in reports (see step 3725 below) to be posted, for example, in the data lake 2005.

Referring again to FIG. 10, one or more embodiments use a CableLabs standard to gather data from a plurality of cable modems 2001-1, 2001-2, 2001-3, . . . using a device 2003 referred to as a poller, via SNMP. In one or more embodiments, poller 2003 is implemented in software on a physical or virtual computing system (e.g., a server) that runs code to gather data from the network. In one or more embodiments, poller 2003 continuously gathers many different kinds of data. FBC data is one of the things the poller 2003 is responsible for capturing and "shipping north" into the rest of the system (e.g., into data lake 2005). Poller 2003 can be, for example, in a head end 150, RDC 1048, NDC 1098, or any other suitable location with network connectivity.

One or more embodiments infer an ideal channel map/spectrum from an aggregation of the nodes and subtract that from the actual signal, so that it is possible to see only what the plant is contributing to the spectrum. In this way, for example, it can be determined that waves are not contributed by the CMTS. It is known what the CMTS is sending out, that is subtracted out, and whatever is left is an effect of the plant. Thus, in one or more embodiments, take the signal measured in the field, subtract out what was injected by the CMTS, and the difference is an artifact of losses/anomalies in the network. The differences show up as patterns such as resonant peak, notch, (standing) wave, and the like.

Prior-art analyses are capable of discovering broad problems in the plant (i.e., plant is good/bad) but cannot diagnose why there are problems. Advantageously, one or more embodiments are more prescriptive than prior art techniques; i.e., they can identify why there are problems in the plant (e.g., resonant peak or other issues described herein, and the like). Impairments can be shown on a dashboard, for example.

The "spectrum noise" impairment is a catch-all for anomalous patterns that do not fit into any of the other categories. "Adjacency" refers to a case where some set of interfaces is broadcasting at a higher level than those directly adjacent to it. "Unusable low power" refers to a case where power has dropped below a certain threshold: by way of example and not limitation, a SNR over 30 might be needed to function correctly and the SNR may have dropped to 20. The "filter" impairment can be explained as follows. Historically, (legacy) filters may have been placed in the field to filter out certain frequencies (high pass, low pass, band pass or the like). This may have been done, for example, to block certain services that a subscriber did not pay for. One non-limiting example would be a high pass filter that blocks anything below 400 MHz (i.e., passes only signals above 400 MHz). Locations of these legacy filters may not be known. FBC (for those modems with FBC capability) permits locating these legacy filters. The "noise" impairment refers to injection of noise from sources such as frequency modulation (FM) broadcast radio waves or Long-Term Evolution (LTE) (or other) wireless telephony signals. The "Spectrum tilt" impairment refers to a slope in the spectrum.

The ability to detect "filter" impairments is believed to be particularly valuable. As alluded to above, filters were often installed outside a customer's home to block certain frequencies/disable services/disconnect for non-payment. While no longer used, these legacy filters are harmful for modern networks: they interfere with self-install, cause problems with in-home wiring, and their presence is often not known.

For example, a customer may be shipped a new cable modem and it may not work well because of the presence of a filter. One or more embodiments enable remote detection of filters. This allows proactive removal of filters so that customers do not suffer future impairment when signing up for new services. For example, when a technician is nearby for another call, the technician can be instructed to remove an old filter.

Thus, one or more embodiments look at a geographic area (e.g., a node), identify the reference spectrum by looking at all of the spectra within the given node, and then find the anomalies based on the reference spectrum. The filters can be detected because it is known that other modems in the given node do not have the anomalous pattern.

In one or more embodiments, to carry out pattern matching, look for an upward and/or downward slope to find a notch, or "three down/three up" (three consecutive channels with lower amplitude and then three consecutive channels with higher amplitude). One or more embodiments use a mathematical threshold, looking for changes in slope and/or a sudden drop in the signal. Machine learning (ML) can be used to correlate IVR (interactive voice response) and/or other customer service calls and trouble calls to certain patterns in the spectrum to identify impairments (even including those not yet being mapped)—this aspect can be used, for example, to weight the severity of impairments by seeing how many phone calls are caused by each type of impairment (more phone calls will be considered more severe).

In addition to the poller 2003 parsing data and identifying impairments, in one or more embodiments, the poller computes statistics suitable for display. A suitable user interface can be constructed, for example, using existing mapping and graphing software. Non-limiting examples of suitable programs include Mapbox® software available from Mapbox, Inc. San Francisco, CA, US; reactjs (a well-known JavaScript library for building user interfaces), graphing libraries (e.g., D3.js which is a JavaScript library for manipulating documents based on data); and the like. In one or more embodiments, a correlation engine 2006, discussed elsewhere herein, carries out functionality other than data presentation (which is handled, for example, with a data presentation layer). The correlation engine carries out polling, data collection, storage, and correlation.

Now, consider sending the parsed files to the data lake 2005. In one or more embodiments, the data lake is a large data warehouse or data store such as Hadoop Distributed File System (HDFS) or the like. In one or more embodiments, each cable modem has its own JavaScript Object Notation (JSON) string. JSON and XML are non-limiting formats for storing text to be used by the algorithm(s). In one or more embodiments, there is a single JSON file for each CMTS, and another file indexes into the single (large) CMTS file. The index file can be written, for example, to function with a suitable search and analytics solution/database search engine such as Elasticsearch® software or the like (Elasticsearch BV Amsterdam NETHERLANDS). An example index can have, for example, millions of cable modems in one or more embodiments.

JSON entries for single cable modem may include, for example, a set of impairments, start and stop frequencies for each impairment, a file path to the details of the impairment(s), position in the file, and any other appropriate information. In general, JSON files can be organized using known software, including raw files, index files, and so on, as will be appreciated by the skilled artisan.

One or more embodiments have a variety of practical applications, including, responsive to diagnosing impairments, correcting impairments such as by fixing breaks in the line and/or loose connectors, removing old filters, replacing bad amplifiers, and so on—in general, changing the physical structure of the network responsive to detecting issues therein. Advantageously, one or more embodiments provide analysis and correlation/relation to specific types of impairments in the plant (obtaining spectra and analyzing them in a way that correlates to specific kinds of impairments). Known and unknown ("strange") impairments, for example, can be identified in one or more embodiments. For each impairment type, the expected resolution and workflow can be set forth. For example, if a standing wave is seen, the technician should take action X; if a notch is seen, the technician should take action Y, and so on. A computer-generated work order can be employed in one or more embodiments to dispatch a technician to a certain location because it has a sever standing wave. The technician can be instructed to test for A, B, and C and then to replace D, depending on the results of the test(s). The technician can then carry out the test(s) and replacement(s) as needed. Other non-limiting examples of remediation/repair actions include removing old filters, cutting out and replacing rodent-chewed wires or abraded wires, applying silicon sealant to prevent water egress, applying EMI shielding to prevent FM egress, tightening loose connectors, and the like. In some instances, the work order is for an impacted node identified by geographic clustering.

In some instances, a technician carries out other regularly scheduled work and the system prepares a before and after snapshot to see if the work made an improvement (or detriment). Some embodiments can also predict churn rate—for areas with a higher level of severe impairment, one can anticipate a higher churn rate (i.e., subscribers change providers or drop cable altogether). In some cases, designate enhanced capital investment to such areas to fix the plant, designate marketing efforts to try to convince people to stay (possibly with incentives), and/or provide a higher tier of service to try to head off churn. One or more embodiments also help to identify what kind of technician to send when the customer calls with a problem. For example, currently, to see if there is an outside plant problem, a field technician is typically to the customer's house, who then identifies that there is a plant problem; then, a plant technician has to be dispatched to fix the issue. One or more embodiments identify the appropriate technician to send the first time.

FIG. 12 shows an example of a resonant peak issue impacting a significant fraction of premises in a node. In particular, as seen at 3123, there are 213 FBC-enabled devices, 123 of which are not impaired; 21 are experiencing notching and 62 resonant peaks are noted. Note that there are a total of 213 devices but there are more impairments than devices; one device can have multiple impairments. Locations 3127, 3129 can show details of individual modems and accounts; FIG. 13 is an example detailed view 3129. Note a notch N and four resonant peaks RP, with some overlap. In FIG. 12, the user has clicked on "notch," so all locations with a notch are highlighted (indicated by shading; all premises in the node are not shown in view 3125 to avoid clutter). If the user were to click on "noise," the homes with noise will instead be highlighted. Generally, the user clicks on a particular impairment and the homes with that impairment are highlighted on the map. If the user clicks on unimpaired devices, 123 homes will be highlighted. Note that 4 waves have been located. In view 3125, the highlighted dots represent devices with the highlighted "notch" while the non-highlighted (open) dots represent those without notching. Spectrum 3129 shows one notch and four resonant peaks. Map 3125 shows the locations of devices. FIG. 13 shows an exemplary detailed FBC spectra for the device (cable modem) shown at 3129.

Consider determining what leg is impaired/locating a branch off a node. A technician can look at the street map in FIG. 12 and apply a plant map. In FIG. 12, note the dividing line between open (not impacted) and shaded (notching impairment) premises—with the top of the figure as "north," the technician sees that the issue begins on the north side of Third Street. The technician coordinates the view of FIG. 12 with a plant map to locate the part of the plant that is actively impaired.

A variety of physical plant problems can be found and corrected using aspects of the invention, for example, that connectors on an amplifier housing were loose and could be corrected by tightening of the connectors or replacement of the connectors or in some instances the whole amplifier. In some instances, aspects of the invention can be used to proactively replace potentially faulty connectors or other potentially faulty physical plant components, before subscribers experience issues.

Figure 14:
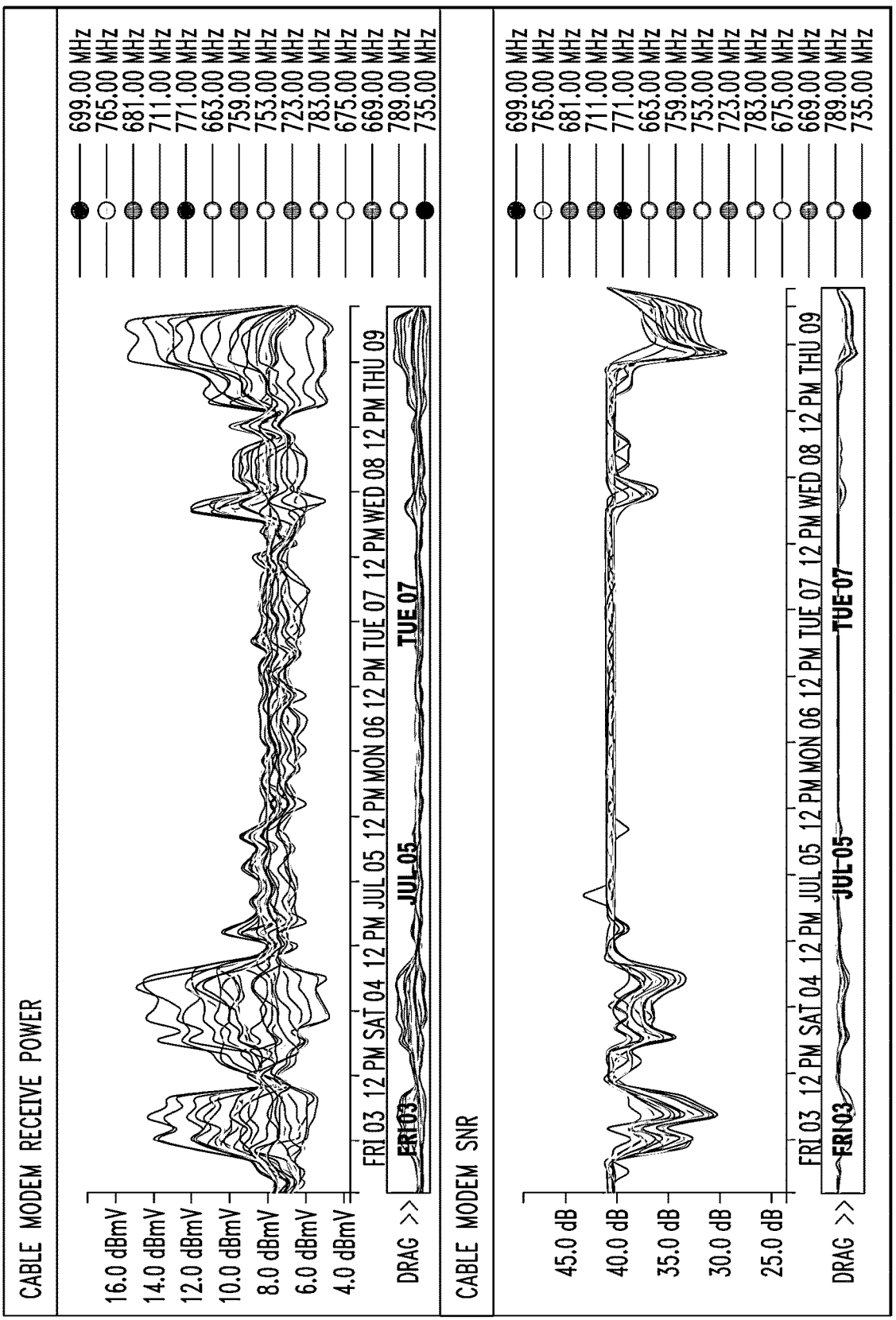
FIG. 14 shows an example of a graphical user interface (GUI) illustrating cable modem received power and signal-to-noise ratio, in accordance with an aspect of the invention.
Figure 15:
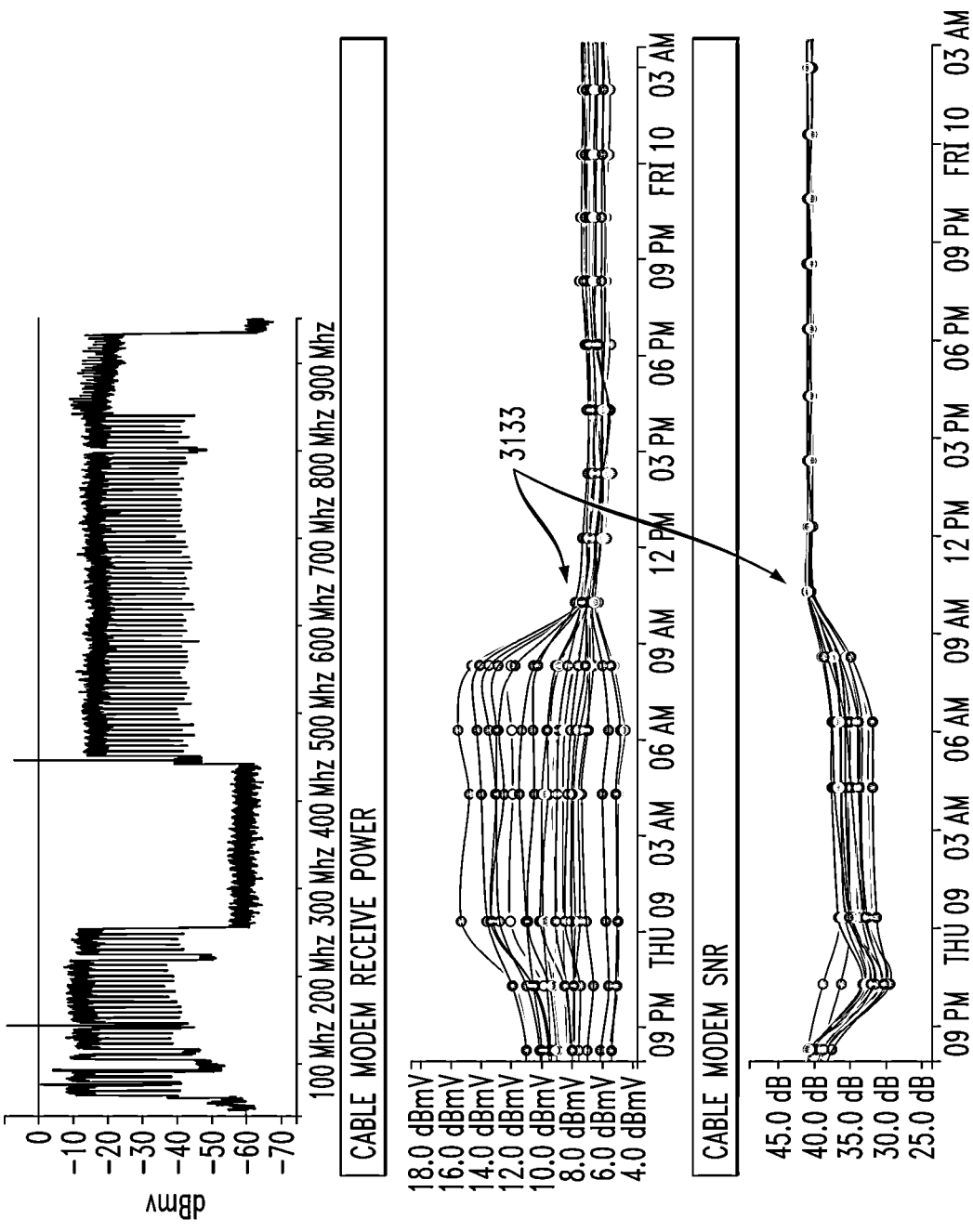
FIG. 15 shows an example of a graphical user interface (GUI) illustrating FBC readings useful in one or more embodiments of the invention as well as cable modem received power and signal-to-noise ratio, in accordance with an aspect of the invention.

FIG. 14 shows cable modem received power and SNR for a typical cable modem. FIG. 15 shows a post-fix FBC (received power and SNR) for an exemplary cable modem. As can be seen by the bold arrows emanating from location 3133 in FIG. 15, it can be inferred that, in this example, the issue was resolved when the technician swapped out a bad amplifier (or a bad module in an amplifier, for example).

In another aspect, as a cause of serious FM ingress and/or notching a technician might find, for example, multiple damaged spans of cable feeding the impacted devices, due to abrasion, rodent bites, etc. A work order may be dispatched to replace damaged cable, for example.

Heretofore, systems have taken basic metrics such as signal level strength, represented as an integer value, and checked for correspondence to a geographical area; for example, a certain group of homes with a common kind of impairment all having bad transmit levels or bad receive levels. FBC is different than these traditional metrics. FBC metrics cannot be represented as a single integer; they are effectively images. In essence, FBC metrics are patterns that must be correlated against multiple different dimensions to identify whether there is an impairment and to identify what a common impairment looks like. FBC metrics are generally not amenable to steady-state global comparison: a modem at location A may well look very different than a modem at location B; the two different spectra/FBC readings will typically look very different. One typically cannot say a priori that all modems should have a spectrum that looks like "X."

Furthermore in this regard, in one or more embodiments, first establish what an expected spectrum should be, and then identify from that what a deviation looks like, then further identify common kinds of deviation, and determine what common sets of homes have a common set of impairments. Rather than simply specifying that the transmit level should never be greater than a certain amount, say, 55, in one or more embodiments, what is being examined is a line graph pattern of a cable modem's spectrum. A baseline or expected pattern is identified, as well as those modems whose patterns deviate from that baseline. In one or more embodiments, obtain FBC data from many modems using known techniques such as those promulgated by CableLabs as discussed elsewhere herein. This results in a large bucket of FBC data, which is taken as a starting point in one or more embodiments. For each cable modem, first, check that it is legitimate and actual spectrum data has been obtained. Examine for filters, hi-split, etc., and determine whether the lower channels are populated. If so, it will be known that there is no filter. If not, apply the filter impairment detection routine where an examination is made for a ramp-up around 300-400 MHz (frequency range to check for start of ramp; between 600 and 700 MHz examination can be made for the end of the ramp). The length of the impairment can be shortened depending on properties of the filter. In one or more embodiments, iterate through each individual channel, look at the power on the channel, and determine whether the power is attenuated by a legacy filter. That is, for an individual modem, determine whether it is impacted by a legacy filter because a region of the spectrum where a signal is expected does not in fact have expected power present in that region. For example, employ a series of comparison statements in a high-level programming language. Once it is determined whether the cable modem has a filter, move on to the rest of the impairments.

For notching detection, skip the frequencies in the filter band. Look for overlap; e.g., if there is notching at 450-500 MHz and 460-510 MHz, combine them into a single occurrence from 450-510 MHz. Once all the data from the cable modems on a given CMTS is available, apply the impairment identification, look at the channels, and see what channels are present/missing/OFDM (as will be apparent to the skilled artisan, OFDM channels have a different chape than conventional QAM channels). One or more embodiments send all the amplitude data up to the data lake 2005 with the impairments and channel metadata, and make it available to the next set of jobs/computational tasks/analyses. One or more embodiments parse the json string and send the data to an index which makes it available to the front end. One or more embodiments obtain latitude and longitude from the account itself—e.g., from a billing server or a geocoding job that looks up the address and geocodes it. Clusters can then be visually located, or located by suitable database queries. For example, in one or more embodiments, the system identifies a node of several hundred homes that has a common group of impairments. In one or more embodiments, as discussed with respect to FIG. 12, locate a branch off a node referencing a plant map. One or more embodiments issue an alert where there is a high concentration of impairments such as notching, resonant peaks, filters, or the like.

It is worth noting that prior art systems may have a number of pre-defined impairments that can be located on a per-cable modem basis; however, one or more embodiments can locate and flag hitherto unknown impairments, via comparison to an expected spectrum.

Figure 16:
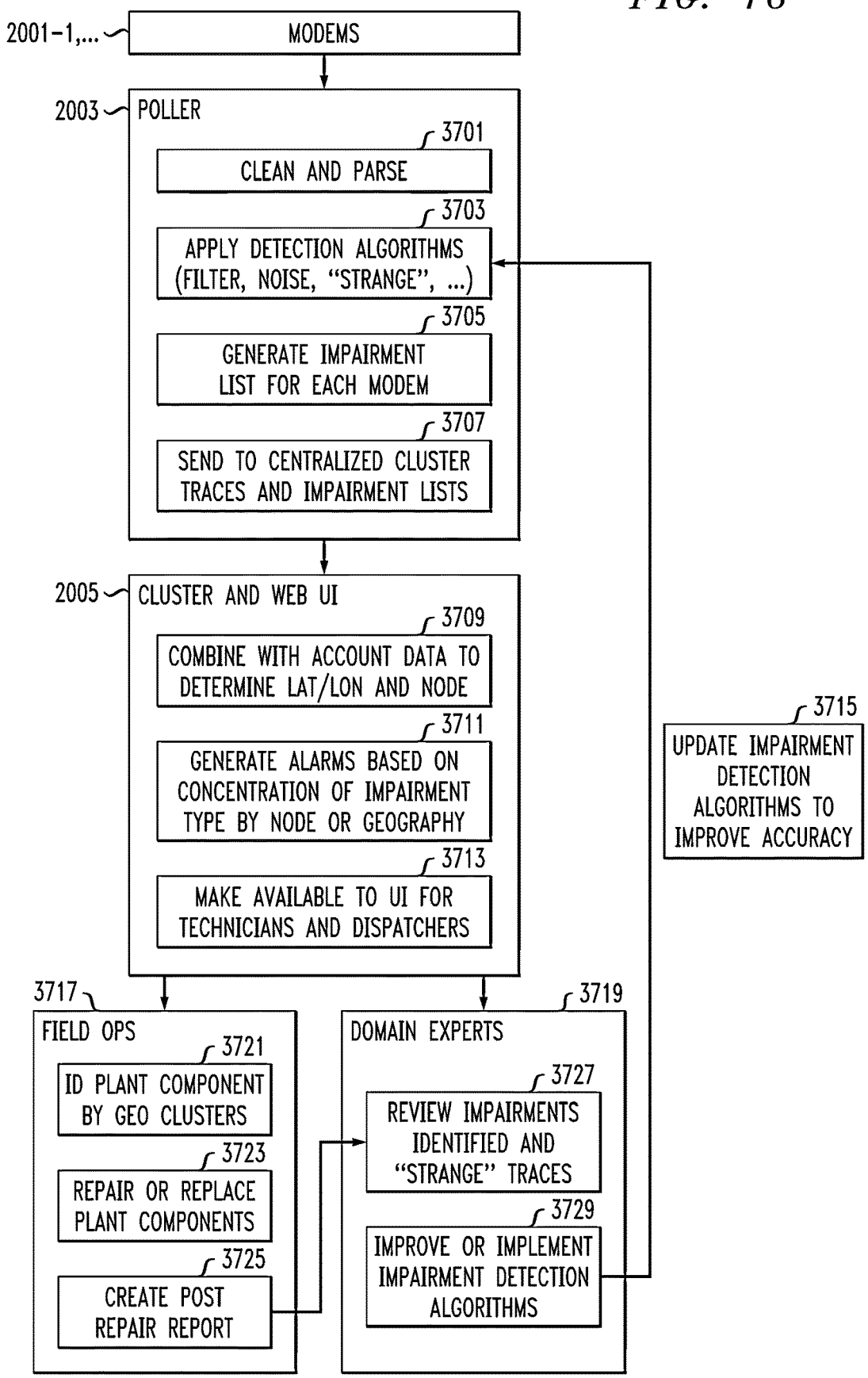
FIG. 16 is a detailed combined block diagram and flow chart of an embodiment of a system and method, in accordance with an aspect of the invention.

Referring now to FIG. 16, in one or more embodiments, the modems 2001-1, . . . provide the data, and the poller 2003 collects the data, and makes it useful, in a well-known manner. Poller 2003 cleans and parses the data at 3701. Regarding step 3703, "apply detection algorithms (Filter, Noise, "Strange," . . . ), note the feedback loop 3715 of detecting patterns and re-applying the results to the collection methodology and then applying more patterns and so on. Much current work relies on pre-defined patterns wherein a human being pre-determines that a certain pattern corresponds to an impairment. A human developer or engineer looks at a spectral read and says, "this pattern is this impairment." In contrast, in one or more embodiments, the system itself is able to say, "this phenomenon looks like a set of patterns across this population of devices." For example, referring to step 3703, note "filter," "noise," and "strange." "Filter" and "noise" are both predefined patterns (for example, the system found them previously and a human has defined them already). On the other hand, "strange" indicates that the system has found something suspicious but it has not yet been categorized. Regarding feedback loop 3715, this aspect is not just the system generating new patterns; rather, as new patterns are identified, it pushes that new pattern through a recognition system for other established patterns in the system. There is a feedback loop that allows the refinement of the pattern groupings as users manipulate and enrich the system. The next step 3705, "generate impairment list for each modem," is premised on the previous step. Step 3707, sending the traces and impairment lists to a centralized cluster (e.g., data lake 2005) can be done using known techniques.

In step 3709, identify the geographic parameters (e.g., latitude, longitude) of the account and show it on a map, indicating that a certain cluster of homes has a certain kind of impairment. In step 3711, place an alarm/generate an alert, based, for example, on the concentration of impairment types by node or geography. In step 3713, the information is made available to the user interface for the benefit of technicians and dispatchers (for example, in a network operations center or the like). In the field operations block 3717, in step 3721, impacted plant components are identified by geographic clusters; in step 3723, faulty components are repaired or replaced; and in step 3725, a post-repair report is created.

Note the feedback line from step 3725 to step 3727 in the domain experts block 3719. Block 3719 also received input from the system regarding the detection of "strange" patterns. The human SME is prompted by the system, with an indication that an unknown potential impairment has been identified. The human SME is asked to identify the impairment (e.g., classify it as a known type or define a new type), or to indicate that it is not an issue. The output is fed back into the original polling and detection system at 3715, with the new, now-identified impairment added to the list of known impairment patterns. The information can also be provided to a field operations center (e.g., water in the tap at location X) so the issue can be fixed. Thus, in block 3719, the SME reviews identified impairments and "strange" traces in step 3727 and improves or implements impairment detection algorithms in step 3729, from which the feedback loop proceeds. Feedback from the field tech (arrow from 3725 to 3727) is, for example, computerized in the sense there is a UI and a human navigates within it; this step is optional in one or more embodiments. For example, a human SME might only consult the UI if he or she sees a new type of impairment and is not sure what it is.

Accordingly, in one or more embodiments, the system identifies strange patterns and presents them to the SME in a useful way so that the SME can label them. The strange patterns are identified, for example, by analyzing many millions of traces across the entire enterprise. Looking at the whole spectrum, and excluding the plant-induced signal components, a set of patterns are generated that can be grouped together in a meaningful way. One or more embodiments identify new types of impairments, subtract out the baseline, predict churn, and/or determine what type of technician to dispatch.

Furthermore, regarding excluding the plant-induced signal components, one or more embodiments infer an ideal channel map/spectrum from an aggregation of the nodes and subtract that from the actual signal, so that all that is visible is what the plant itself is contributing to the spectrum (the system and/or SME then looks to see if the absolute value of this "delta" signal exceeds zero by more than a predetermined value, such as 2-3 dB). One or more embodiments dynamically determine what the spectrum should look like in a given area, in order to create an anomaly detection system. It is pertinent in one or more embodiments to be able to automatically determine the baseline; otherwise, it may not be feasible to readily locate anomalies.

Figure 17:
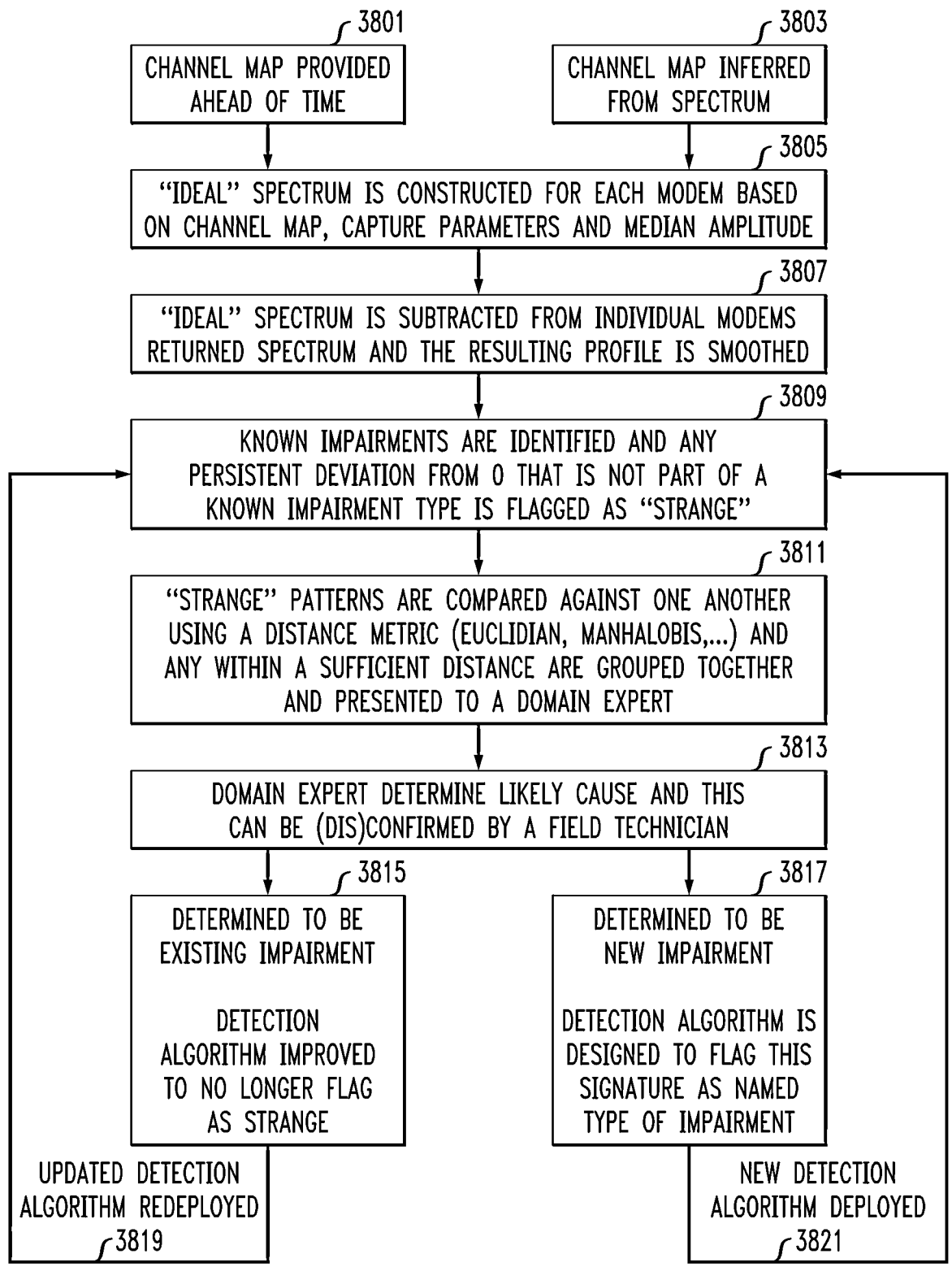
FIG. 17 is a detailed flow chart of an embodiment of a method, in accordance with an aspect of the invention.

Referring now to FIG. 17, in one or more embodiments, a channel list is provided, as per step 3801, or one is inferred, as per step 3803, based on the power and median amplitude of channels as well as the standard deviation of channel powers, to determine the type of channel. In step 3805, an "ideal" spectrum is constructed based on the channel map created in the previous step(s), using, for example, Root Raised Cosine for standard channels and Tukey window for Orthogonal Frequency Division Multiplexing (OFDM). The spectrum returned from the device is used to determine median amplitude and the ideal spectrum is set to that amplitude, then subtracted from the received spectrum, in step 3807. The resultant profile is assumed to be the contribution from the plant. Any persistent deviation from zero that is not identified as an existing impairment is then flagged as "strange" in step 3809. The "strange" patterns are compared against one another to identify similar-seeming patterns and are presented to a human on a single page, in step 3811. A domain expert can create a theory regarding the "strange" impairment in step 3813 and have it confirmed by a field technician. Based on the findings, a new impairment type is created in step 3817 or an existing one is improved to account for this representation of the impairment type in step 3815. The updated impairment identification algorithms are deployed to the pollers as per the feedback branches 3819, 3821. Regarding the channel map on an individual cable modem, if there is an impairment such that it appears that there is not a populated channel in some portion of the spectrum, but there in fact is, and the impairment makes it appear as if that channel is not populated, the ideal spectral reading will be incorrectly determined. One or more embodiments thus combine all the modems on the node to obtain a more accurate reading of where there are populated channels and where there are not.

Recapitulation

Given the discussion thus far, it will be appreciated that, in general terms, an exemplary method, according to an aspect of the invention, includes the step of collecting a full band capture spectral reading from a plurality of cable/fiber broadband network customer units (e.g., cable modems 2001-1, 2001-2, 2001-3, . . . or S-ONU 822). This step can be carried out, for example, by poller 2003 using known techniques as described elsewhere herein. A further step (e.g., 3805) includes, for each of the cable/fiber broadband network customer units, constructing an ideal spectral reading. A still further step (e.g., 3807) includes, for each of the cable/fiber broadband network customer units, subtracting the ideal spectrum from the full band capture spectrum to obtain a resultant spectrum. Yet a further step (e.g., 3809) includes, for at least one of the cable/fiber broadband network customer units, identifying a persistent deviation from zero in the resultant spectrum that does not match a known impairment type. The preceding constructing, subtracting, and identifying steps can be carried out, for example, by the correlation engine 2006 coupled to the data lakes 2005 and the poller(s) 2003 via suitable network connections, local wired connections, or the like. An even further step (e.g., 3813) includes identifying at least one new impairment type corresponding to the persistent deviation from zero. The just-described identifying step can be carried out, for example, by correlation engine 2006 coupled to data lake 2005 providing a user interface (e.g., GUI) to a human subject matter expert, via which GUI input is obtained from the human SME to label the strange pattern. Refer to steps 3727, 3729.

Broadband cable/fiber is used herein to refer to a primarily wired network using coaxial cable and/or fiber optic cable, such as shown in FIGS. 1-9.

Note that examples have been set forth in the RF/cable modem domain; however, readings of optical wavelengths similar to the RF FBC readings described could be taken. The engine and other components could be used to identify impairments/patterns within the optical domain. Thus, for Cu or RF-modulated systems the RF FBC analysis discussed herein can be employed; for optical wavelengths, an optical wavelength analysis can be employed.

Regarding the full band/full spectrum, in one or more embodiments, this includes video, broadband data, and anything modulated on the carriers. For example, VOD, switched video, QAM video, high-speed data, etc. are all included in one or more embodiments. In one or more embodiments, the collecting step is carried out periodically, responsive to the poller requesting a trace (a suitable timer can be provided, for example, to trigger the poller). In a non-limiting example, the full spectrum is approximately 80-1000 MHz; however, the upper bound can extend as high in the RF spectrum as the modem is utilizing. The skilled artisan will of course appreciate that radio frequency (RF) is the oscillation rate of an alternating electric current or voltage or of a magnetic, electric or electromagnetic field or mechanical system in the frequency range from around 20 kHz to around 300 GHz, roughly between the upper limit of audio frequencies and the lower limit of infrared frequencies; these are the frequencies at which energy from an oscillating current can radiate off a conductor into space as radio waves. Fiber optic communications are carried out at wavelengths in the light portion of the electromagnetic spectrum; e.g., by way of example, O, E, S, C, L, and U bands ranging from wavelengths of 1260 nm up to 1675 nm but any suitable optical wavelengths can be employed (infrared, visible, ultraviolet) as may be developed.

Furthermore, regarding construction of the ideal spectral reading in step 3805, in one or more embodiments, a channel list is provided, as per step 3801, or one is inferred, as per step 3803, based on the power and median amplitude of channels as well as the standard deviation of channel powers, to determine the type of channel. In step 3805, the "ideal" spectrum is constructed based on the channel map created in the previous step(s), using, for example, Root Raised Cosine for standard channels and Tukey window for OFDM. The spectrum returned from the device is used to determine median amplitude and the ideal spectrum is set to that amplitude, then subtracted from the received spectrum, in step 3807. The resultant profile is assumed to be the contribution from the plant. Thus, in one or more embodiments, constructing the ideal spectral reading is based on a node-wide channel map for a subset of the cable modems associated with a node.

Refer to FIG. 11. Obtain, for example, an analog signal, digitize it in a known manner, display a frequency domain representation, sweep through the frequency range, and carry out the subtraction. To restate, in one or more embodiments, in the frequency domain, iterate over individual channels. The start/stop frequencies of the channels are known. Take the mean value of the channels; from the median of the medians, determine the approximate amplitude level of a populated channel. Via this process it can be determined what channels are and are not populated. A determination can be made regarding where OFDM is located, if present (e.g., by comparing the max and min of channels to estimate where they are located). Eventually, an actual channel map will be known a priori as per step 3801. For the ideal channel map on an individual cable modem, the issue may arise that if the impairment is such that there appears to not be a populated channel someplace, but there in fact is such a channel in that location, the ideal spectrum/spectra will be wrong. Thus, in one or more embodiments, combine the readings with the rest of the modems on the node to obtain a more accurate reading of where there are populated channels and where there are not. Furthermore regarding FIG. 11 and step 3809 in FIG. 17, one or more embodiments apply a threshold to determine if the absolute value of the smoothed delta exceeds zero by more than a threshold (non-limiting examples include, say 2 dB or 3db or 5 dB).

Furthermore in this regard, in one or more embodiments, there is an array of channels; for each channel, the data includes whether populated, not populated, populated in OFDM. Populated channels are typically root raised cosine shaped (i.e., if one zooms in on the spectrum, it is trapezoidal rather than a perfect rectangle). Pilot channels are typically flat with a noise floor; the noise floor can be determined on the initial pass, for example. The medians are computed (the skilled artisan will understand that pilot channels include small carriers that provide modems with an index of the other content of the spectrum).

Referring to FIG. 11, note the empty area 3167. Notice that ideal 3162 drops to the noise floor and then even below the noise floor. Directly adjacent to a channel, the bottom of the empty area is at the noise floor and then the bottom of the empty area drops below the noise floor. There are thus two noise floors—one adjacent to the channel and another for completely dead air.

The process in FIG. 11 can be carried out, for example, by digitizing the signals and processing same using software written in high-level code to implement the logic described herein and to compile/interpret same to render it executable. Smoothing can be carried out, for example, using a Wiener filter.

In one or more embodiments, correlation engine 2006 is coupled to the data lake 2005. Engine 2006, in one or more embodiments compares the spectrums. In one or more embodiments, the correlation engine operates once data is uploaded to the data lake 2005. In one or more embodiments, patterns are deployed to the poller 2003 to identify the known impairments. The engine 2006 coupled to lake 2005 carries out additional processing, such as correlation, adding in billing data, and the like. In one or more embodiments, data is available for all of the cable modems on a node, so that the ideal spectrum can be developed for the whole node. This latter step occurs, for example, in the correlation engine 2006 coupled to the data lake/cluster 2005. Thus, in one or more embodiments, the correlation engine 2006 is coupled to the data lake 2005 and constructs the ideal spectrum. Similarly, engine 2005 subtracts the ideal spectrum from the FBC data in one or more embodiments. In one or more embodiments, engine 2006 identifies the persistent deviations from zero.

Correlation engine 2006 can be implemented, for example, by one or more physical servers, virtualized or not virtualized, including code with logic that implements the techniques described herein.

Identification of new impairment types can be carried out, for example, with a suitable user interface=e.g., through a web page to a human subject matter expert (SME). This allows, for example, for the user to ID/tag new/strange impairments.

One or more embodiments further include (e.g., step 3821) applying a new label to the new impairment type and deploying a new detection pattern configured to detect and label occurrences of the new impairment type. For example, in one or more embodiments, each poller has a copy of the library 2008 of known impairments (IMP. LIB.=impairment library), which is updated from the data lake with new impairments as the same are identified. In one or more embodiments, the system advantageously flags unknown impairments, and a human subject matter expert labels the unknown impairment. The labeled impairment is then deployed to the library and resides on the poller. That is to say, data that characterizes the newly labeled impairment is stored in the poller 2003. In one or more embodiments, when the system finds an unknown impairment, it makes up an internal name such as BLUE SKY. A human subject matter expert then edits BLUE SKY to, for example, WATER LEAK IN JUNCTION BOX, and sends the data characterizing WATER LEAK IN JUNCTION BOX down to the poller(s) as a new entry in the library. Thus, one or more embodiments deploy an identified pattern to the poller that the poller can use for comparison with impairments.

Note that a "master copy" of the library could be maintained in the data lake 2005, for example.

It is worth noting that in one or more embodiments, the algorithm described with respect to the figures determines there is a new/strange impairment pattern and presents that to the human SME. A series of comparison statements in high-level code that is compiled or interpreted to make it computer-executable can be employed, for example. Identified patterns of "strange" impairments that have now been identified and labeled by the human SME, and are thus no longer "strange," are deployed to the poller to look for known impairments going forward.

One or more embodiments further include, for at least another one of the cable modems, identifying a persistent deviation from zero in the resultant spectrum that matches a known impairment type stored in the library. Refer to step 3809. In some instances, the system identifies two separate patterns that are in fact the same pattern. For example, the system has identified "minor notch" and "major notch" as two different patterns. A human SME can merge the two as simply "notching." It is also possible to label a pattern identified by the system as strange/unknown as actually part of a known pattern and then just send an updated pattern definition to the poller (e.g., pattern flagged by system as "strange" is actually the known impairment "notching." This latter aspect is similar to the example of merging "minor notch" and "major notch" into "notching" (i.e., combining two existing labels). If the system has labeled two separate things (e.g., standing wave and water in tap) as the same thing, then the human SME may need to work with a program developer to update the code to add capability into the detection algorithms to separate the two different impairments.

One or more embodiments further include (e.g., step 3821) storing the labeled new impairment type as a newly known impairment type in the library 2008.

One or more embodiments further include (e.g., step 3821) applying a new label to the new impairment type and deploying a new detection algorithm configured to detect and label occurrences of the new impairment type.

One or more embodiments further include, for at least another one of the cable modems, identifying a persistent deviation from zero in the resultant spectrum that does not match a known impairment type; and determining that the persistent deviation from zero in fact should match one of a plurality of known impairment types. Refer to step 3815. In such embodiments, a further step includes updating an existing detection pattern to better detect and label occurrences of the one of the plurality of known impairment types. Refer to step 3819.

In one or more embodiments, identifying the at least one new impairment type includes obtaining input, at a computerized user interface device, from at least one human subject matter expert. Refer to step 3719.

One or more embodiments further include electronically initiating remediation of an identified impairment; e.g., the at least one new impairment type. In some instances, for each impairment type, set forth an expected resolution and workflow: e.g., if a STANDING WAVE is seen, do X; if a NOTCH is seen, do Y. One or more embodiments initiate a computer-generated work order—for example, dispatch a technician to Maple Street because it has a bad standing wave. The work order can specify, for example, that the technician should test for A, B, and C and replace component D. In some instances, the work order is for an impacted node identified by geographic clustering. It will be appreciated that one or more embodiments further include physically remediating the at least one new impairment type in response to the electronic initiation. For example, the technician may repair breaks in a line, tighten loose connectors, remove old filters, replace one or more bad amplifiers, and the like. In another aspect, the physical structure of the network is changed in response to detecting issues. As noted, one or more embodiments determine what kind of technician to send to address the issue(s). Thus, the physical remediation could include selecting a technician type to dispatch from among plurality of technician types (e.g., fulfillment technician who works inside home/premises versus plant maintenance technician who works on the outside plant).

One or more embodiments further include identifying the persistent deviation from zero in the resultant spectrum, that does not match the known impairment type, for a plurality of the cable modems, and geographically clustering the persistent deviations for the plurality of cable modems prior to the identifying step. Refer to step 3811. In some instances, suitable remediations can be applied to prevent, or reduce the likelihood of "churn" (i.e., customer dissatisfaction and turnover) for the impacted area. For example, electronically initiate remediation of at least one issue based on the geographic clustering.

One or more embodiments further include identifying a plurality of additional impairments (e.g., known); applying computerized machine learning (ML) to identify user impact of the plurality of additional impairments; and prioritizing remediation of the plurality of additional impairments in accordance with the identified user impact. For example, a certain type of impairment, such as a notch, results in a certain kind of customer behavior/impact, such as people complaining about tiling on a popular movie network. One or more embodiments use machine learning in that the impact of impairments depends on what frequencies are being impacted, what these frequencies are used for (e.g., switched digital video, VOD, and the like), what the level of impairment is, and so on. One or more embodiments feed into an ML system all the impairments in a given area, behavior patterns of customers in that area, and determine correlations. For example, ML determines that a notch causes people to complain about poor picture quality in a popular movie channel—the goal is to identify common sets of impairments and prioritize work for repair. In some instances, sweep the network during the night. It might be found, for example, that there is a new notch in the portion of the frequency that carries the ACME network morning news, this notch needs to be fixed immediately because everyone wants to watch the ACME network morning news. Supervised or unsupervised learning can be employed, for example. In the former case, a human SME annotates a training corpus including a number of historical impairments and a number of historical customer behavior patterns; a neural network or other machine learning system is trained on the annotated corpus, and performance is checked on a test corpus. When performance is satisfactory, the trained model is deployed to predict customer behavior going forward. The neural network can be implemented on engine 2006 for example, with the test corpus and training corpus in data lake 2005 for example.

In another aspect, an exemplary system includes a poller 2003 configured to collect a full band capture spectral reading from a plurality of cable/fiber broadband network customer units (e.g., modems 2001-1, 2001-2, 2001-3, . . . or equivalent optical units); and a correlation engine 2006, coupled to the poller. The engine 2006 can be coupled to the data lake 2005. The cable modems can be associated with different nodes, for example. Multiple pollers can be provided, for example. The correlation engine can be configured to, for each of the cable/fiber broadband network customer units, construct an ideal spectral reading; for each of the cable/fiber broadband network customer units, subtract the ideal spectral reading from the full band capture spectral reading to obtain a resultant spectrum; for at least one of the cable/fiber broadband network customer units, identify a persistent deviation from zero in the resultant spectrum that does not match a known impairment type; and facilitate identification of at least one new impairment type corresponding to the persistent deviation from zero. In general, the engine can be configured to carry out or otherwise facilitate any one, some, or all of the corresponding method steps described herein. Facilitation can be, for example, by interaction with a human SME using a GUI.

System and Article of Manufacture Details

The invention can employ hardware aspects or a combination of hardware and software aspects. Software includes but is not limited to firmware, resident software, microcode, etc. One or more embodiments of the invention or elements thereof can be implemented in the form of an article of manufacture including a machine-readable medium that contains one or more programs which when executed implement such step(s); that is to say, a computer program product including a tangible computer readable recordable storage medium (or multiple such media) with computer usable program code configured to implement the method steps indicated, when run on one or more processors. Furthermore, one or more embodiments of the invention or elements thereof can be implemented in the form of an apparatus including a memory and at least one processor that is coupled to the memory and operative to perform, or facilitate performance of, exemplary method steps.

Yet further, in another aspect, one or more embodiments of the invention or elements thereof can be implemented in the form of means for carrying out one or more of the method steps described herein; the means can include (i) specialized hardware module(s), (ii) software module(s) executing on one or more general purpose or specialized hardware processors, or (iii) a combination of (i) and (ii); any of (i)-(iii) implement the specific techniques set forth herein, and the software modules are stored in a tangible computer-readable recordable storage medium (or multiple such media). Appropriate interconnections via bus, network, and the like can also be included.

As is known in the art, part or all of one or more aspects of the methods and apparatus discussed herein may be distributed as an article of manufacture that itself includes a tangible computer readable recordable storage medium having computer readable code means embodied thereon. The computer readable program code means is operable, in conjunction with a computer system, to carry out all or some of the steps to perform the methods or create the apparatuses discussed herein. A computer readable medium may, in general, be a recordable medium (e.g., floppy disks, hard drives, compact disks, EEPROMs, or memory cards) or may be a transmission medium (e.g., a network including fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk. The medium can be distributed on multiple physical devices (or over multiple networks). As used herein, a tangible computer-readable recordable storage medium is defined to encompass a recordable medium, examples of which are set forth above, but is defined not to encompass transmission media per se or disembodied signals per se. Appropriate interconnections via bus, network, and the like can also be included.

Figure 7:
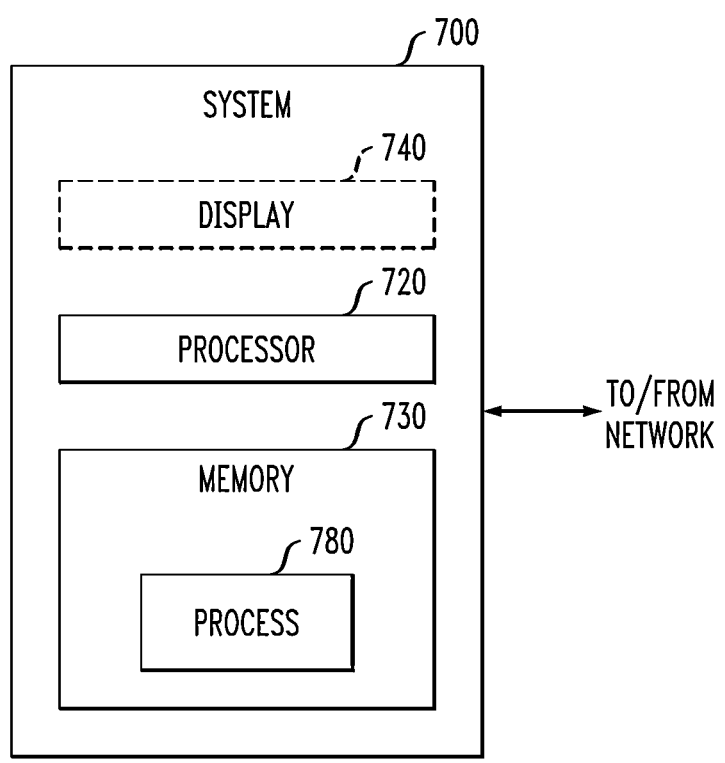
FIG. 7 is a block diagram of a computer system useful in connection with one or more aspects of the invention.

FIG. 7 is a block diagram of at least a portion of an exemplary system 700 that can be configured to implement at least some aspects of the invention, and is representative, for example, of one or more of the apparatus or modules shown in the figures. As shown in FIG. 7, memory 730 configures the processor 720 to implement one or more methods, steps, and functions (collectively, shown as process 780 in FIG. 7). The memory 730 could be distributed or local and the processor 720 could be distributed or singular. Different steps could be carried out by different processors, either concurrently (i.e., in parallel) or sequentially (i.e., in series).

The memory 730 could be implemented as an electrical, magnetic or optical memory, or any combination of these or other types of storage devices. It should be noted that if distributed processors are employed, each distributed processor that makes up processor 720 generally contains its own addressable memory space. It should also be noted that some or all of computer system 700 can be incorporated into an application-specific or general-use integrated circuit. For example, one or more method steps could be implemented in hardware in an ASIC rather than using firmware. Display 740 is representative of a variety of possible input/output devices (e.g., keyboards, mice, and the like). Every processor may not have a display, keyboard, mouse or the like associated with it.

The computer systems and servers and other pertinent elements described herein each typically contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

Accordingly, it will be appreciated that one or more embodiments of the present invention can include a computer program comprising computer program code means adapted to perform one or all of the steps of any methods or claims set forth herein when such program is run, and that such program may be embodied on a tangible computer readable recordable storage medium. As used herein, including the claims, unless it is unambiguously apparent from the context that only server software is being referred to, a "server" includes a physical data processing system running a server program. It will be understood that such a physical server may or may not include a display, keyboard, or other input/output components. Furthermore, as used herein, including the claims, a "router" includes a networking device with both software and hardware tailored to the tasks of routing and forwarding information. Note that servers and routers can be virtualized instead of being physical devices (although there is still underlying hardware in the case of virtualization).

Furthermore, it should be noted that any of the methods described herein can include an additional step of providing a system comprising distinct software modules or components embodied on one or more tangible computer readable storage media. All the modules (or any subset thereof) can be on the same medium, or each can be on a different medium, for example. The modules can include any or all of the components shown in the figures. The method steps can then be carried out using the distinct software modules of the system, as described above, executing on one or more hardware processors. Further, a computer program product can include a tangible computer-readable recordable storage medium with code adapted to be executed to carry out one or more method steps described herein, including the provision of the system with the distinct software modules.

Accordingly, it will be appreciated that one or more embodiments of the invention can include a computer program including computer program code means adapted to perform one or all of the steps of any methods or claims set forth herein when such program is implemented on a processor, and that such program may be embodied on a tangible computer readable recordable storage medium. Further, one or more embodiments of the present invention can include a processor including code adapted to cause the processor to carry out one or more steps of methods or claims set forth herein, together with one or more apparatus elements or features as depicted and described herein.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method comprising:
   with at least one hardware processor, over a broadband network, collecting a full band capture spectral reading from a plurality of broadband network customer units;
   with the at least one hardware processor, for each of said broadband network customer units, constructing an ideal spectral reading;
   with the at least one hardware processor, for each of said broadband network customer units, subtracting said ideal spectral reading for the corresponding broadband network customer unit from said full band capture spectral reading from the corresponding broadband network customer unit to obtain a resultant spectrum;
   with the at least one hardware processor, for at least one of said broadband network customer units, identifying a persistent deviation from zero in said resultant spectrum that does not match a known impairment type;
   with the at least one hardware processor, identifying at least one new impairment type corresponding to said persistent deviation from zero; and
   electronically initiating remediation of at least one new impairment type.

2. The method of claim 1, wherein, in said collecting step, said broadband network comprises a cable/fiber broadband network and wherein, in said collecting, constructing, and subtracting steps, said broadband network customer units comprise cable/fiber broadband network customer units.

3. The method of claim 2, wherein, in said collecting, constructing, and subtracting steps, said plurality of cable/fiber broadband network customer units comprise a plurality of cable modems, and wherein, in said identifying step, said at least one of said cable/fiber broadband network customer units comprises at least one of said cable modems.

4. The method of claim 3, further comprising applying a new label to said new impairment type and deploying a new detection pattern configured to detect and label occurrences of said new impairment type.

5. The method of claim 4, further comprising, for at least another one of said cable modems, identifying a persistent deviation from zero in said resultant spectrum that matches a known impairment type stored in a library.

6. The method of claim 5, further comprising storing said labeled new impairment type as a newly known impairment type in said library.

7. The method of claim 3, further comprising, for at least another one of said cable modems, identifying a persistent deviation from zero in said resultant spectrum that does not match a known impairment type; and determining that said persistent deviation from zero in fact should match one of a plurality of known impairment types.

8. The method of claim 7, further comprising updating an existing detection pattern to better detect and label occurrences of said one of said plurality of known impairment types.

9. The method of claim 3, wherein identifying said at least one new impairment type comprises obtaining input, at a computerized user interface device, from at least one human subject matter expert.

10. The method of claim 3, further comprising identifying said persistent deviation from zero in said resultant spectrum, that does not match said known impairment type, for a plurality of said cable modems, and geographically clustering said persistent deviations for said plurality of cable modems prior to said identifying.

11. The method of claim 10, further comprising electronically initiating remediation of at least one issue based on said geographic clustering.

12. The method of claim 3, further comprising physically remediating said at least one new impairment type in response to said electronic initiation.

13. The method of claim 12, wherein said physical remediation comprises selecting a technician type to dispatch from a plurality of technician types.

14. The method of claim 3, further comprising:
    identifying a plurality of additional impairments;
    applying computerized machine learning to identify user impact of said plurality of additional impairments; and
    prioritizing remediation of said plurality of additional impairments in accordance with said identified user impact.

15. The method of claim 3, wherein constructing said ideal spectral reading is based on a node-wide channel map for a subset of said cable modems associated with a node.

16. A system comprising:
    a memory; and
    at least one processor, coupled to said memory, and operative to:
        collect, over a broadband network, a full band capture spectral reading from a plurality of broadband network customer units; and for each of said broadband network customer units, construct an ideal spectral reading;

for each of said broadband network customer units, subtract said ideal spectral reading for the corresponding broadband network customer unit from said full band capture spectral reading from the corresponding broadband network customer unit to obtain a resultant spectrum;

for at least one of said broadband network customer units, identify a persistent deviation from zero in said resultant spectrum that does not match a known impairment type;

facilitate identification of at least one new impairment type corresponding to said persistent deviation from zero; and electronically initiate remediation of said at least one new impairment type.

17. The system of claim 16, wherein said broadband network comprises a cable/fiber broadband network and said broadband network customer units comprise cable/fiber broadband network customer units.

18. The system of claim 17, wherein said plurality of cable/fiber broadband network customer units comprise a plurality of cable modems, and said at least one of said cable/fiber broadband network customer units comprises at least one of said cable modems.

19. The system of claim 18, wherein said at least one processor is further operative to facilitate application of a new label to said new impairment type and to deploy a new detection pattern configured to detect and label occurrences of said new impairment type.

20. The system of claim 19, wherein said at least one processor is further operative to, for at least another one of said cable modems, identify a persistent deviation from zero in said resultant spectrum that matches a known impairment type stored in a library.

21. The system of claim 19, wherein said at least one processor is further operative to store said labeled new impairment type as a newly known impairment type in said library.

22. The system of claim 18, wherein said at least one processor is further operative to, for at least another one of said cable modems, identify a persistent deviation from zero in said resultant spectrum that does not match a known impairment type; and facilitate determination that said persistent deviation from zero in fact should match one of a plurality of known impairment types.

23. The system of claim 22, wherein said at least one processor is further operative to facilitate updating an existing detection pattern to better detect and label occurrences of said one of said plurality of known impairment types.

24. The system of claim 18, wherein said at least one processor is further operative to facilitate identifying said at least one new impairment type by obtaining input, at a computerized user interface, from at least one human subject matter expert.

25. The system of claim 18, wherein said at least one processor is further operative to identify said persistent deviation from zero in said resultant spectrum, that does not match said known impairment type, for a plurality of said cable modems, and to geographically cluster said persistent deviations for said plurality of cable modems prior to said identification.

26. The system of claim 25, wherein said at least one processor is further operative to electronically initiate remediation of at least one issue based on said geographic clustering.

27. The system of claim 18, wherein said at least one processor is further operative to:
identify a plurality of additional impairments;
apply computerized machine learning to identify user impact of said plurality of additional impairments; and
prioritize remediation of said plurality of additional impairments in accordance with said identified user impact.

28. The system of claim 18, wherein said at least one processor is further operative to construct said ideal spectral reading based on a node-wide channel map for a subset of said cable modems associated with a node.

29. A non-transitory computer readable medium comprising computer executable instructions which when executed by a computer cause the computer to perform a method of:
over a broadband network, collecting a full band capture spectral reading from a plurality of broadband network customer units;
for each of said broadband network customer units, constructing an ideal spectral reading;
for each of said broadband network customer units, subtracting said ideal spectral reading for the corresponding broadband network customer unit from said full band capture spectral reading from the corresponding broadband network customer unit to obtain a resultant spectrum;
for at least one of said broadband network customer units, identifying a persistent deviation from zero in said resultant spectrum that does not match a known impairment type;
identifying at least one new impairment type corresponding to said persistent deviation from zero; and
electronically initiating remediation of said at least one new impairment type.

* * * * *